(12) United States Patent
Chiu

(10) Patent No.: US 12,550,343 B2
(45) Date of Patent: Feb. 10, 2026

(54) SEMICONDUCTOR DEVICE WITH ELECTRODE HAVING STEP-SHAPED SIDEWALL AND METHOD FOR PREPARING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 423 days.

(21) Appl. No.: 18/242,076

(22) Filed: Sep. 5, 2023

(65) Prior Publication Data

US 2025/0081479 A1    Mar. 6, 2025

(51) Int. Cl.
| H10D 1/68 | (2025.01) |
| H01G 4/005 | (2006.01) |
| H01G 4/01 | (2006.01) |
| H10B 12/00 | (2023.01) |
| H10D 1/00 | (2025.01) |

(52) U.S. Cl.
CPC ............ *H10D 1/696* (2025.01); *H01G 4/005* (2013.01); *H01G 4/01* (2013.01); *H10B 12/033* (2023.02); *H10D 1/043* (2025.01); *H10D 1/714* (2025.01); *H10D 1/716* (2025.01)

(58) Field of Classification Search
CPC ........ H10D 1/696; H10D 1/043; H10D 1/714; H10D 1/716; H10B 12/033; H01G 4/005; H01G 4/30; H01G 4/32; H01G 4/302; H01G 4/306; H01G 4/308; H01G 4/01; H01G 4/012; H01G 4/385; H01G 4/38
See application file for complete search history.

(56) References Cited

U.S. PATENT DOCUMENTS

| 5,745,335 A * | 4/1998 | Watt ........................ H01G 4/232 |
| | | 361/308.1 |
| 2022/0254792 A1 | 8/2022 | Kim |
| 2023/0282687 A1* | 9/2023 | Wu ....................... H10B 12/315 |
| | | 257/534 |

FOREIGN PATENT DOCUMENTS

| EP | 4415010 A1 * | 8/2024 | ............... H10D 1/62 |
| TW | 201840006 A | 11/2018 | |

(Continued)

OTHER PUBLICATIONS

Office Action and and the search report mailed on Oct. 18, 2024 related to Taiwanese Application No. 112144633.

*Primary Examiner* — Jose R Diaz
(74) *Attorney, Agent, or Firm* — Xuan Zhang

(57) ABSTRACT

A semiconductor device includes a bottom electrode structure disposed over a semiconductor substrate. The bottom electrode structure includes a first metal layer, a second metal layer, a third metal layer, a fourth metal layer, and a fifth metal layer from bottom to top. The first metal layer, the third metal layer and the fifth metal layer include a first metal material, and the second metal layer and the fourth metal layer include a second metal material different from the first metal material. The semiconductor device also includes a high-k dielectric structure disposed on opposite sidewalls of the bottom electrode structure. The opposite sidewalls of the bottom electrode structure are step-shaped. The semiconductor device further includes a top electrode structure laterally surrounding the bottom electrode structure and separated from the bottom electrode structure by the high-k dielectric structure.

20 Claims, 21 Drawing Sheets

(56) References Cited

FOREIGN PATENT DOCUMENTS

| TW | 202005101 A | 1/2020 |
| TW | 202114177 A | 4/2021 |
| TW | 202232585 A | 8/2022 |

* cited by examiner

SEMICONDUCTOR DEVICE WITH ELECTRODE HAVING STEP-SHAPED SIDEWALL AND METHOD FOR PREPARING THE SAME

TECHNICAL FIELD

The present disclosure relates to a semiconductor device and a method for preparing the same, and more particularly, to a semiconductor device with an electrode having a step-shaped sidewall and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, wafer level chip scale packaging (WLCSP) is widely used for its low cost and relatively simple processes. Furthermore, numerous manufacturing operations are implemented within such small semiconductor devices.

However, the manufacturing and integration of semiconductor devices involve many complicated steps and operations. An increase in the complexity of manufacturing and integration of semiconductor devices may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a bottom electrode structure disposed over a semiconductor substrate. The bottom electrode structure includes a first metal layer, a second metal layer disposed over the first metal layer, a third metal layer disposed over the second metal layer, a fourth metal layer disposed over the third metal layer, and a fifth metal layer disposed over the fourth metal layer. The first metal layer, the third metal layer and the fifth metal layer include a first metal material, and the second metal layer and the fourth metal layer include a second metal material different from the first metal material. The semiconductor device also includes a high-k dielectric structure disposed on opposite sidewalls of the bottom electrode structure. The opposite sidewalls of the bottom electrode structure are step-shaped. The semiconductor device further includes a top electrode structure laterally surrounding the bottom electrode structure and separated from the bottom electrode structure by the high-k dielectric structure.

In an embodiment, the first metal layer has a first width, the second metal layer has a second width, the third metal layer has a third width, the fourth metal layer has a fourth width, and the fifth metal layer has a fifth width, wherein the first width is greater than the third width, and the third width is greater than the fifth width, and wherein the second width is greater than the fourth width. In an embodiment, the third width is greater than the second width, and the fifth width is greater than the fourth width. In an embodiment, a portion of the top electrode structure extends between the first metal layer and the third metal layer. In an embodiment, another portion of the top electrode structure extends between the third metal layer and the fifth metal layer.

In an embodiment, a top surface of the bottom electrode structure, a top surface of the high-k dielectric structure, and a top surface of the top electrode structure are substantially coplanar with each other. In an embodiment, a melting point of the second metal material is higher than a melting point of the first metal material. In an embodiment, the semiconductor device further includes a first dielectric layer disposed between the semiconductor substrate and the first metal layer, and a second dielectric layer disposed over the first dielectric layer and laterally surrounding the top electrode structure. In an embodiment, the first dielectric layer is separated from the top electrode structure by the high-k dielectric structure. In an embodiment, the second dielectric layer is laterally separated from the top electrode structure by the high-k dielectric structure.

In another embodiment of the present disclosure, a semiconductor device is provided. The semiconductor device includes a bottom electrode structure disposed over a semiconductor substrate. The bottom electrode structure includes a first metal layer, a second metal layer disposed over the first metal layer, a third metal layer disposed over the second metal layer, a fourth metal layer disposed over the third metal layer, and a fifth metal layer disposed over the fourth metal layer. The first metal layer, the third metal layer and the fifth metal layer include a first metal material, and the second metal layer and the fourth metal layer include a second metal material different from the first metal material. The first metal layer has a first width, the second metal layer has a second width, and the third metal layer has a third width, the first width is greater than the third width, and the third width is greater than the second width. The semiconductor device also includes a high-k dielectric structure disposed on opposite sidewalls of the bottom electrode structure, and a top electrode structure laterally surrounding the bottom electrode structure and separated from the bottom electrode structure by the high-k dielectric structure.

In an embodiment, a melting point of the second metal material is higher than a melting point of the first metal material. In an embodiment, the first metal material is aluminum (Al), and the second metal material is copper (Cu). In an embodiment, a top surface of the bottom electrode structure is substantially coplanar with a top surface of the high-k dielectric structure. In an embodiment, a top surface of the top electrode structure is substantially coplanar with the top surface of the high-k dielectric structure. In an embodiment, the semiconductor device further includes a first dielectric layer disposed between the semiconductor substrate and the bottom electrode structure, and a second dielectric layer disposed over the first dielectric layer and laterally surrounding the top electrode structure, wherein a top surface of the second dielectric layer is substantially coplanar with a top surface of the top electrode structure. In an embodiment, the first dielectric layer and the second dielectric layer are separated from the top electrode structure by the high-k dielectric structure.

In an embodiment, the fourth metal layer has a fourth width, and the fifth metal layer has a fifth width, the third width of the third metal layer is greater than the fifth width, and the fifth width is greater than the fourth width. In an embodiment, the bottom electrode structure further includes a sixth metal layer disposed over the fifth metal layer, and a seventh metal layer disposed over the sixth metal layer, wherein the sixth metal layer includes the second metal material, and the seventh metal layer includes the first metal material. In an embodiment, the sixth metal layer has a sixth width, and the seventh metal layer has a seventh width, wherein the fifth width of the fifth metal layer is greater than the seventh width, and the seventh width is greater than the sixth width.

In yet another embodiment of the present disclosure, a method for forming a semiconductor device is provided. The method includes forming a bottom electrode structure over a semiconductor substrate. The formation of the bottom electrode structure includes forming a first metal layer over the semiconductor substrate, forming a second metal layer over the first metal layer, forming a third metal layer over the second metal layer, forming a fourth metal layer over the third metal layer, and forming a fifth metal layer over the fourth metal layer. The first metal layer, the third metal layer and the fifth metal layer include a first metal material, and the second metal layer and the fourth metal layer include a second metal material different from the first metal material. The formation of the bottom electrode structure also includes performing a first dry etching process to partially remove the fifth metal layer, and performing a first wet etching process to partially remove the fourth metal layer after the first dry etching process is performed. The method also includes forming a high-k dielectric layer over the bottom electrode structure, and forming a conductive layer over the high-k dielectric layer. The method further includes performing a planarization process on the conductive layer and the high-k dielectric layer, such that a top electrode structure and a high-k dielectric structure are formed surrounding the bottom electrode structure.

In an embodiment, the second metal material has an etch selectivity with respect to the first metal material during the first wet etching process. In an embodiment, a bottom surface of the fifth metal layer is exposed after the first wet etching process is performed. In an embodiment, a portion of the high-k dielectric layer and a portion of the conductive layer extend between the first metal layer and the third metal layer. In an embodiment, after the first wet etching process is performed, the forming the bottom electrode structure further includes performing a second dry etching process to partially remove the fifth metal layer and the third metal layer, such that a top surface of the second metal layer is exposed.

In an embodiment, after the second dry etching process is performed, the forming the bottom electrode structure further includes performing a second wet etching process to partially remove the fourth metal layer and the second metal layer. In an embodiment, a top surface and a bottom surface of the third metal layer are exposed after the second wet etching process is performed. In an embodiment, after the second wet etching process is performed, the forming the bottom electrode structure further includes performing a third dry etching process to partially remove the fifth metal layer, the third metal layer and the first metal layer. In an embodiment, before the first metal layer is formed, the method further includes forming a first dielectric layer over the semiconductor substrate, forming a second dielectric layer over the first dielectric layer, and etching the second dielectric layer to form an opening exposing a top surface of the first dielectric layer, wherein the first metal layer, the second metal layer, the third metal layer, the fourth metal layer, and the fifth metal layer are formed in the opening. In an embodiment, the top surface of the first dielectric layer is exposed before the high-k dielectric layer is formed.

Embodiments of a semiconductor device with an electrode having a step-shaped sidewall and method for preparing the same are provided in the disclosure. In some embodiments, the semiconductor device includes a bottom electrode structure, a high-k dielectric structure disposed on opposite sidewalls of the bottom electrode structure, and a top electrode structure laterally surrounding the bottom electrode structure and separated from the bottom electrode structure by the high-k dielectric structure. In some embodiments, the opposite sidewalls of the bottom electrode structure are step-shaped. Therefore, the effective area of the capacitor formed by the bottom electrode structure, the high-k dielectric structure, and the top electrode structure can be increased within the same footprint area, and the capacitance per unit area can be increased. As a result, the performance of the semiconductor device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
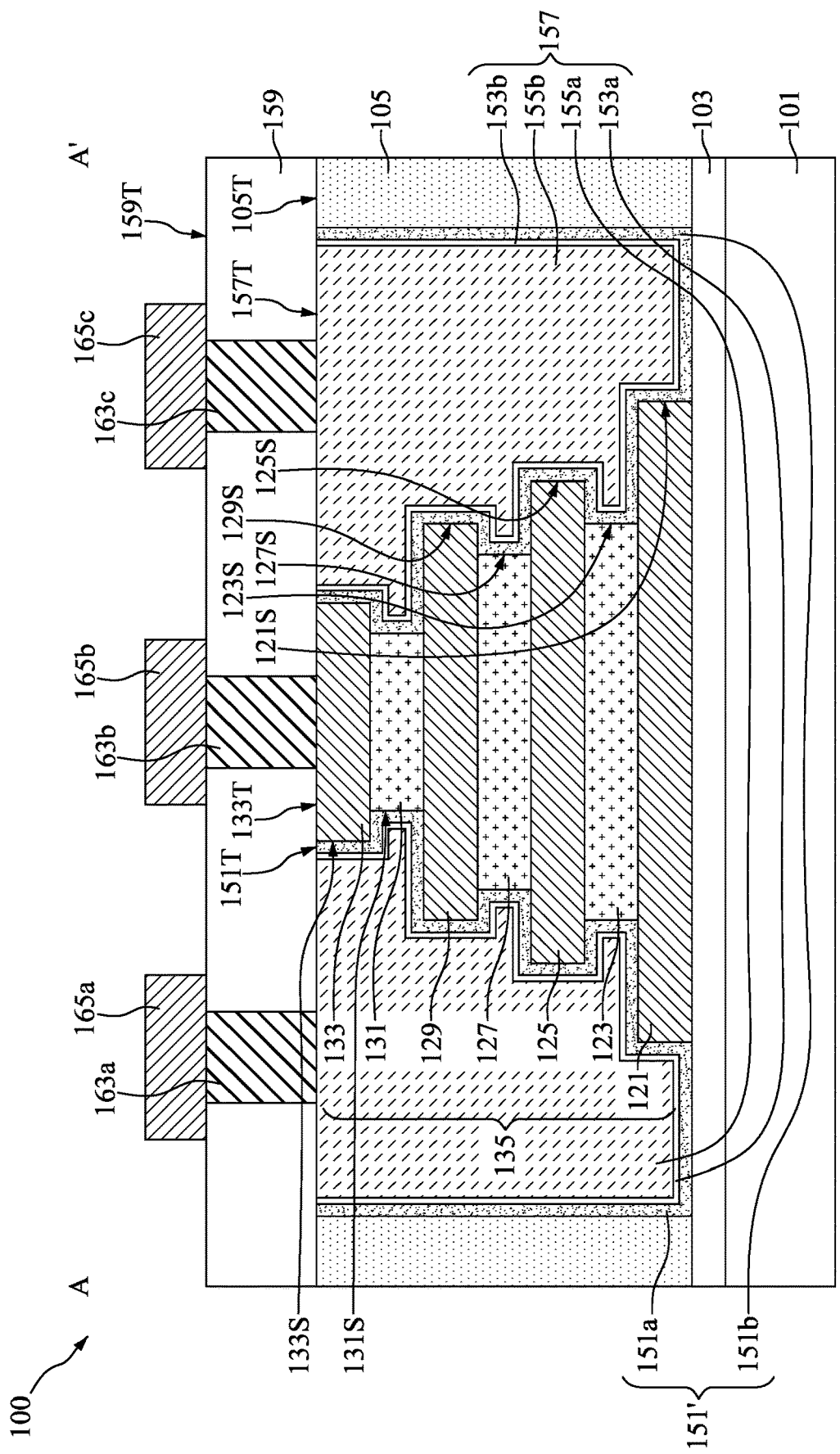
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
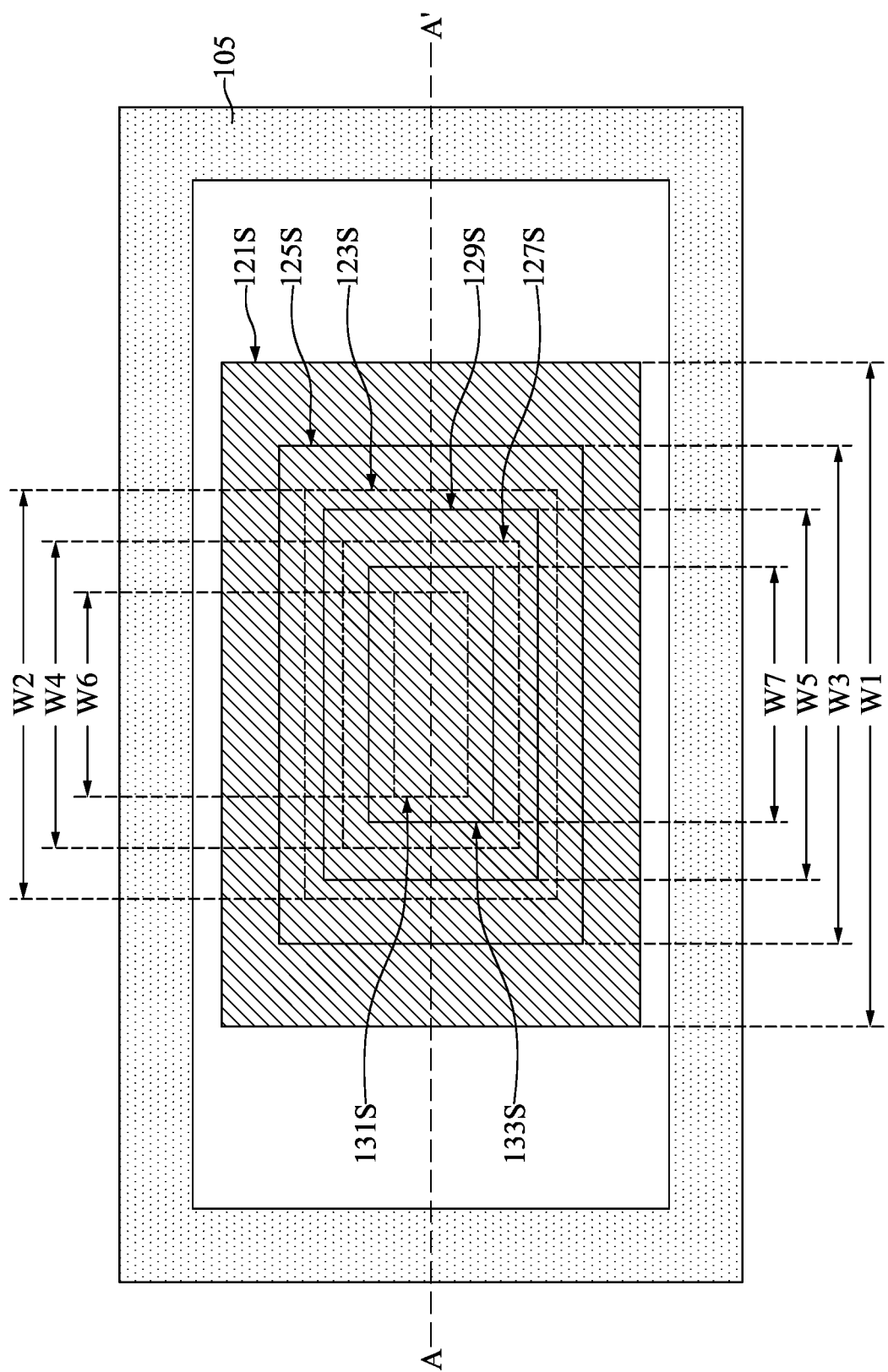
FIG. 2 is a top view illustrating a portion of the semiconductor device, in accordance with some embodiments. The cross-sectional view of FIG. 1 is taken along the sectional line A-A' in FIG. 2.

FIG. 1 is a cross-sectional view illustrating a semiconductor device, and FIG. 2 is a top view illustrating a portion of the semiconductor device (i.e., the second dielectric layer and the metal layers of the bottom electrode structure), in accordance with some embodiments. The cross-sectional view of FIG. 1 is taken along the sectional line A-A' in FIG. 2.

In some embodiments, the semiconductor device 100 includes a semiconductor substrate 101, a first dielectric layer 103 disposed over the semiconductor substrate 101, and a bottom electrode structure 135 disposed over the first dielectric layer 103. In some embodiments, the bottom electrode structure 135 includes a first metal layer 121, a second metal layer 123 disposed over the first metal layer 121, a third metal layer 125 disposed over the second metal layer 123, a fourth metal layer 127 disposed over the third metal layer 125, a fifth metal layer 129 disposed over the fourth metal layer 127, a sixth metal layer 131 disposed over the fifth metal layer 129, and a seventh metal layer 133 disposed over the sixth metal layer 131. In some embodiments, the first metal layer 121, the third metal layer 125, the fifth metal layer 129, and the seventh metal layer 133 include a first metal material, and the second metal layer 123, the fourth metal layer 127, and the sixth metal layer 131 include a second metal material different from the first metal material.

In some embodiments, the semiconductor device 100 also includes a high-k dielectric structure 151' disposed over the first dielectric layer 103 and on opposite sidewalls of the bottom electrode structure 135. In some embodiments, the high-k dielectric structure 151' includes high-k dielectric portions 151a and 151b covering and in direct contact with the sidewalls 121S, 123S, 125S, 127S, 129S, 131S and 133S of the first metal layer 121, the second metal layer 123, the third metal layer 127, the fourth metal layer 129, the fifth metal layer 131, the sixth metal layer 133 and the seventh metal layer 135. In some embodiments, the opposite sidewalls of the bottom electrode structure 135 (i.e., the sidewalls 121S, 123S, 125S, 127S, 129S, 131S and 133S) collectively form a step-shaped profile.

In some embodiments, the semiconductor device 100 further includes a top electrode structure 157 laterally surrounding the bottom electrode structure 135 and separated from the bottom electrode structure 135 by the high-k dielectric structure 151'. In some embodiments, the top electrode structure 157 includes seed portions 153a, 153b and conductive portions 155a, 155b. The conductive portions 155a and 155b are disposed over and surrounded by the seed portions 153a and 153b, respectively, as shown in FIG. 1 in accordance with some embodiments.

In addition, the semiconductor device 100 includes a second dielectric layer 105 disposed over the first dielectric layer 103 and surrounding the bottom electrode structure 135, the high-k dielectric structure 151' and the top electrode structure 157. In some embodiments, the first dielectric layer 103 is separated from the top electrode structure 157 by the high-k dielectric structure 151'. In some embodiments, the second dielectric layer 105 is laterally separated from the top electrode structure 157 by the high-k dielectric structure 151'. In some embodiments, the top surface 105T of the second dielectric layer 105, the top surface 133T of the bottom electrode structure 135 (i.e., the top surface 133T of the topmost metal layer in the bottom electrode structure 135), the top surface 151T of the high-k dielectric structure 151', and the top surface 157T of the top electrode structure 157 are substantially coplanar with each other. Within the context of this disclosure, the word "substantially" means preferably at least 90%, more preferably 95%, even more preferably 98%, and most preferably 99%.

In some embodiments, the semiconductor device 100 includes a third dielectric layer 159 disposed over the second dielectric layer 105 and covering the bottom electrode structure 135, the high-k dielectric structure 151' and the top electrode structure 157. In some embodiments, a plurality of conductive plugs 163a, 163b and 163c are disposed in the third dielectric layer 159, and a plurality of conductive pads 165a, 165b and 165c are disposed over the top surface 159T of the third dielectric layer 159. In some embodiments, the conductive pad 165a is electrically connected to the conductive portion 155a of the top electrode structure 157 through the conductive plug 163a, the conductive pad 165b is electrically connected to the bottom electrode structure 135 through the conductive plug 163b, and the conductive pad 165c is electrically connected to the conductive portion 155b of the top electrode structure 157 through the conductive plug 163c.

FIG. 2 is a top view illustrating the second dielectric layer 105 and the bottom electrode structure 135 of the semiconductor device 100, in accordance with some embodiments. In some embodiments, the sidewalls 121S, 123S, 125S, 127S, 129S, 131S and 133S of the first metal layer 121, the second metal layer 123, the third metal layer 127, the fourth metal layer 129, the fifth metal layer 131, the sixth metal layer 133 and the seventh metal layer 135 are illustrated in FIG. 2.

Moreover, as shown in FIG. 2, the first metal layer 121 has a first width W1, the second metal layer 123 has a second width W2, the third metal layer 125 has a third width W3, the fourth metal layer 127 has a fourth width W4, the fifth metal layer 129 has a fifth width W5, the sixth metal layer 131 has a sixth width W6, and the seventh metal layer 133 has a seventh width W7. In some embodiments, the first width W1 is greater than the third width W3, the third width W3 is greater than the fifth width W5, and the fifth width W5 is greater than the seventh width W7. In some embodiments, the second width W2 is greater than the fourth width W4, and the fourth width W4 is greater than the sixth width W6.

In addition, the third width W3 is greater than the second width W2, the fifth width W5 is greater than the fourth width W4, and the seventh width W7 is greater than the sixth width W6, in accordance with some embodiments.

Embodiments of the semiconductor device 100 with the bottom electrode 135 having step-shaped sidewalls (i.e., the sidewalls 121S, 123S, 125S, 127S, 129S, 131S and 133S) and method for preparing the same are provided in the disclosure. Since the sidewalls of the bottom electrode structure 135 are step-shaped, the effective area of the capacitor formed by the bottom electrode structure 135, the high-k dielectric structure 151', and the top electrode structure 157 can be increased within the same footprint area, and the capacitance per unit area can be increased. As a result, the performance of the semiconductor device 100 can be improved.

Figure 3:
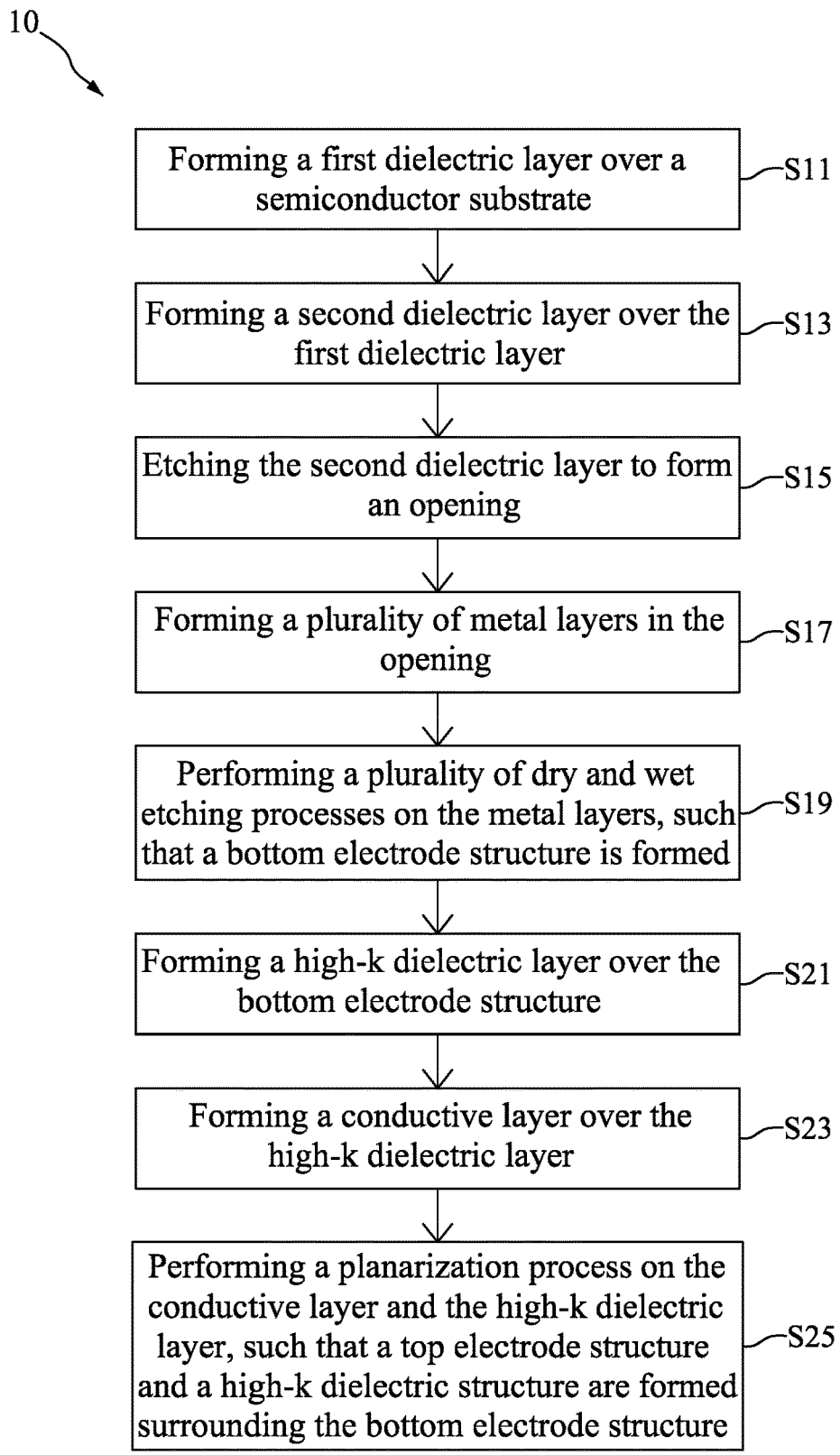
FIG. 3 is a flow diagram illustrating a method for forming a semiconductor device, in accordance with some embodiments.

FIG. 3 is a flow diagram illustrating a method 10 for forming the semiconductor device 100, and the method 10 includes steps S11, S13, S15, S17, S19, S21, S23, and S25, in accordance with some embodiments. The steps S11 to S25 of FIG. 3 are elaborated in connection with the following figures.

Figure 4:
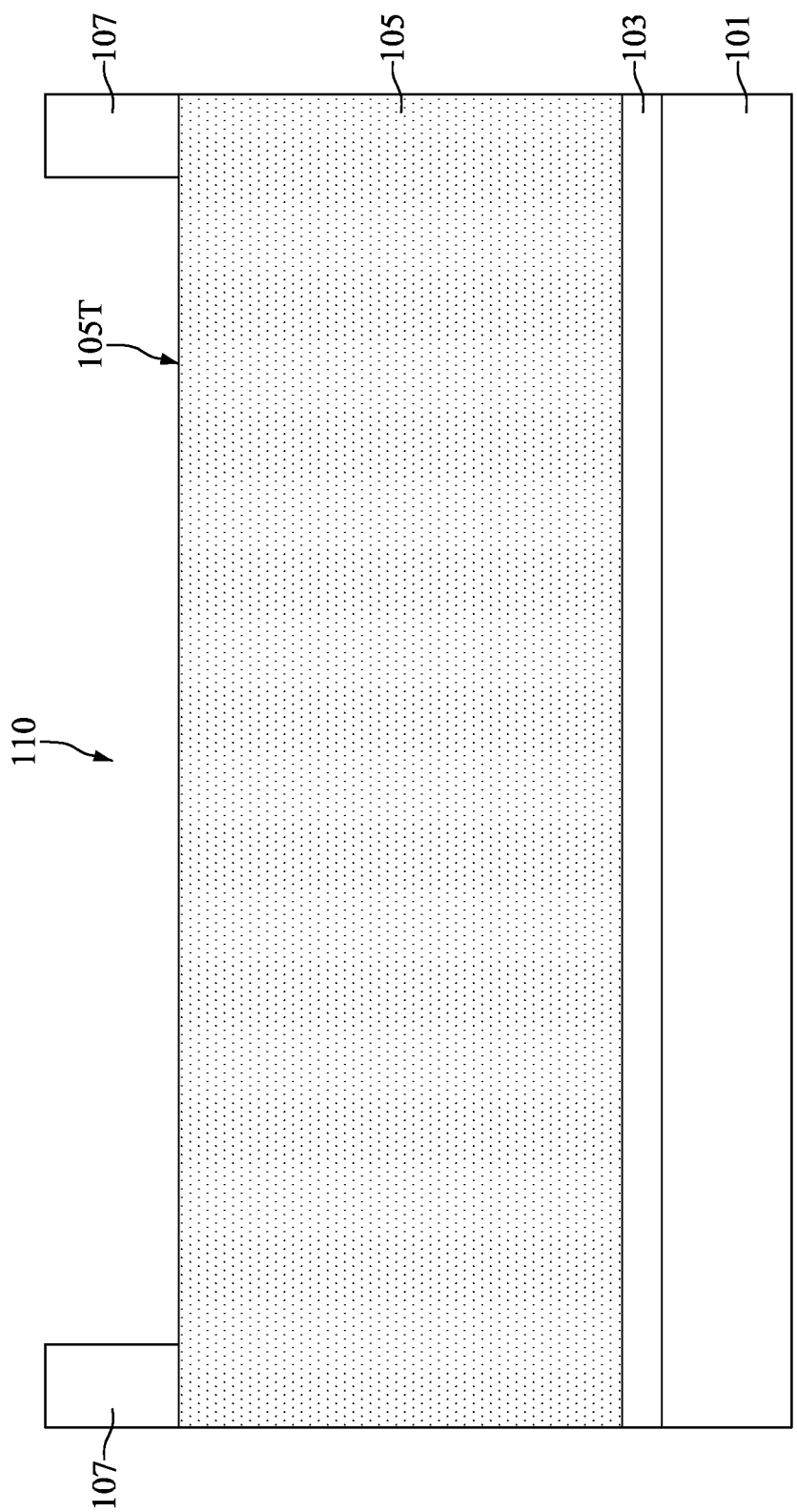
FIG. 4 is a cross-sectional illustrating an intermediate stage of sequentially forming a first dielectric layer and a second dielectric layer over a semiconductor substrate during the formation of the semiconductor device, in accordance with some embodiments.

FIGS. 4 to 21 are cross-sectional views illustrating intermediate stages during the formation of the semiconductor device 100, in accordance with some embodiments. As shown in FIG. 4, a semiconductor substrate 101 is provided. The semiconductor substrate 101 may be or may include a package substrate, an interposer, a printed circuit board (PCB), and/or other circuit carrier that is capable of carrying integrated circuits (IC).

The semiconductor substrate 101 may include various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable integrated circuit (IC) components, or combinations thereof.

Moreover, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The semiconductor substrate 101 has been simplified for the sake of clarity. It should be noted that additional features can be added in the semiconductor substrate 101, and some of the features described below can be replaced, modified, or eliminated in other embodiments.

Still referring to FIG. 4, a first dielectric layer 103 and a second dielectric layer 105 are formed over the semiconductor substrate 101, in accordance with some embodiments. The respective steps are illustrated as the steps S11 and S13 in the method 10 shown in FIG. 3. Then, a patterned mask 107 with an opening 110 is formed over the second dielectric layer 105. In some embodiments, the top surface 105T of the second dielectric layer 105 is exposed by the opening 110.

In some embodiments, the first dielectric layer 103 includes silicon dioxide ($SiO_2$), and the second dielectric layer 105 includes silicon nitride (SiN). However, these materials are merely exemplary. Any other suitable materials may alternatively be used to from the first dielectric layer 103 and the second dielectric layer 105. In some embodiments, the second dielectric layer 105 and the patterned mask 107 include different materials so that the etching selectivities may be different in the subsequent etching process.

Figure 5:
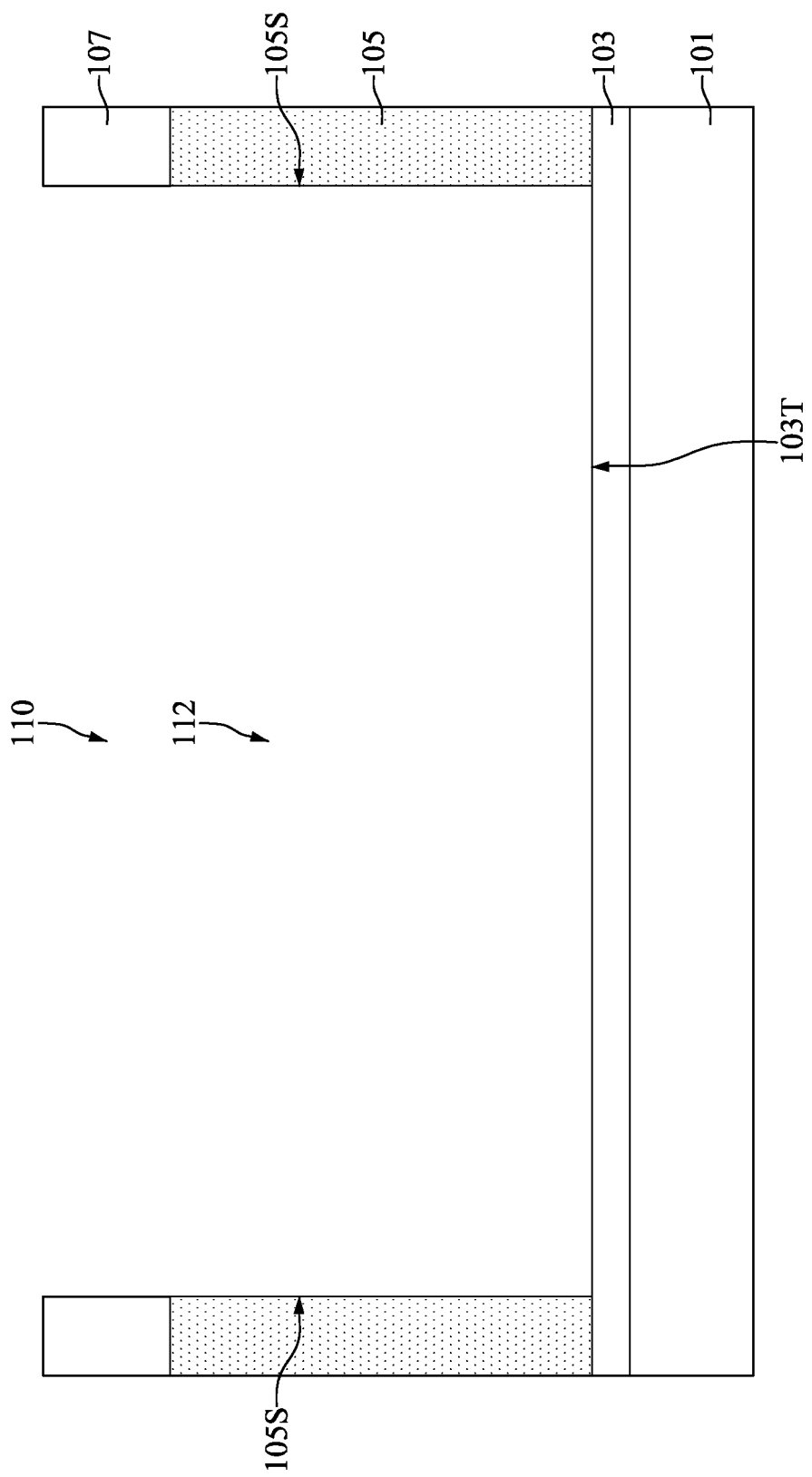
FIG. 5 is a cross-sectional illustrating an intermediate stage of etching the second dielectric layer to form an opening exposing the first dielectric layer during the formation of the semiconductor device, in accordance with some embodiments.

Next, an etching process is performed using the patterned mask 107 as a mask, such that an opening 112 is formed in the second dielectric layer 105, as shown in FIG. 5 in accordance with some embodiments. The respective step is illustrated as the step S15 in the method 10 shown in FIG. 3. In some embodiments, the opening 112 penetrates through the second dielectric layer 105, such that the top surface 103T of the first dielectric layer 103 and the sidewalls 105S of the second dielectric layer 105 are exposed. In some embodiments, the etching process for forming the opening 112 includes a wet etching process, a dry etching process, or a combination thereof. After the opening 112 is formed, the patterned mask 107 may be removed.

Figure 6:
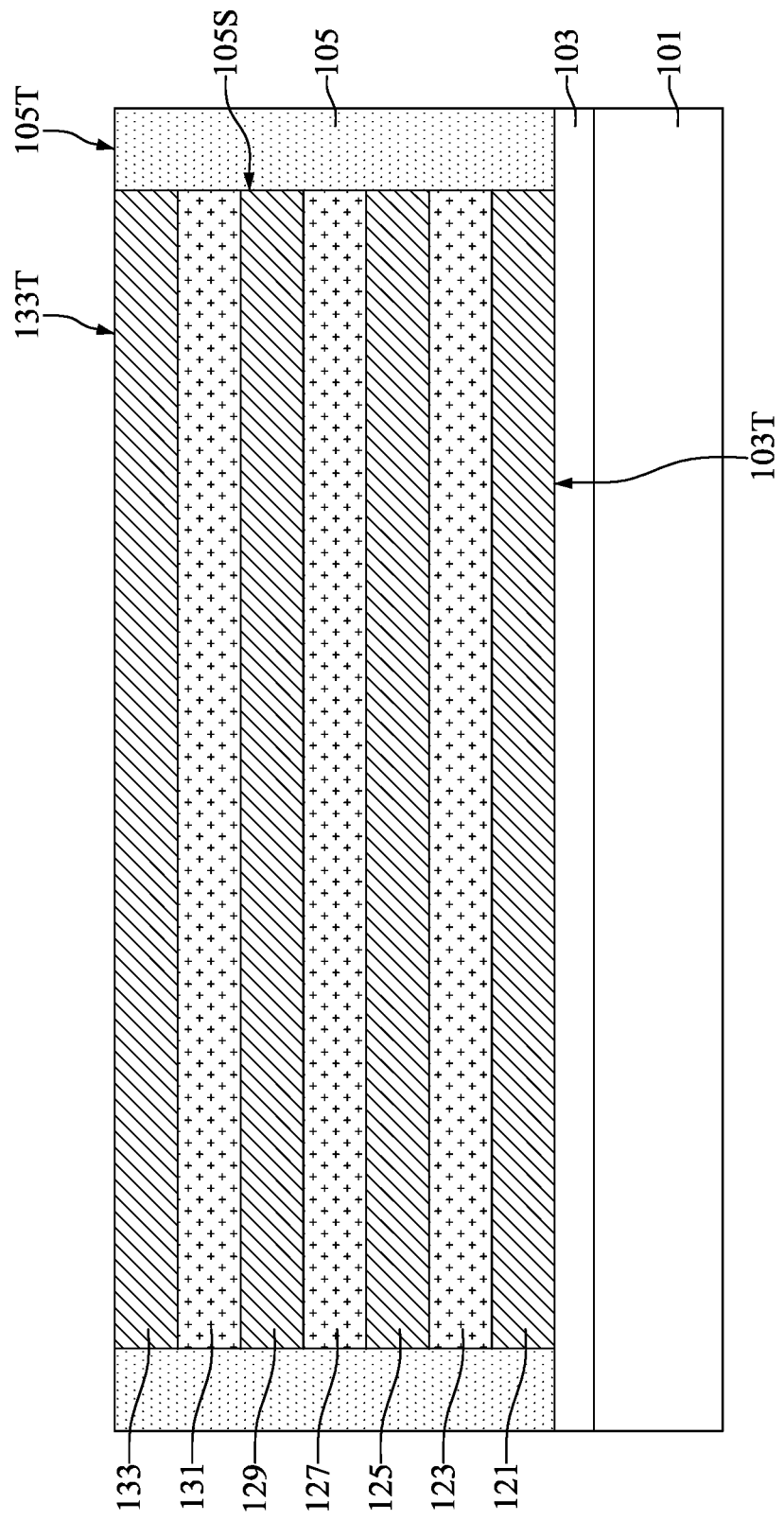
FIG. 6 is a cross-sectional illustrating an intermediate stage of forming a plurality of metal layers (e.g., a first metal layer, a second metal layer, a third metal layer, a fourth metal layer, a fifth metal layer, a sixth metal layer, and a seventh metal layer, from bottom to top) in the opening during the formation of the semiconductor device, in accordance with some embodiments.

Subsequently, a first metal layer 121, a second metal layer 123, a third metal layer 125, a fourth metal layer 127, a fifth metal layer 129, a sixth metal layer 131, and a seventh metal layer 133 are formed in the opening 112, as shown in FIG. 6 in accordance with some embodiments. The respective step is illustrated as the step S17 in the method 10 shown in FIG. 3. In some embodiments, the first metal layer 121 is in direct contact with the top surface 103T of the first dielectric layer 103.

Moreover, in some embodiments, the first metal layer 121, the second metal layer 123, the third metal layer 125, the fourth metal layer 127, the fifth metal layer 129, the sixth metal layer 131, and the seventh metal layer 133 adjoin and in direct contact with the sidewalls 105S of the second dielectric layer 105. In some embodiments, the top surface 133T of the seventh metal layer 133 is substantially coplanar with the top surface 105T of the second dielectric layer 105.

As mentioned above, the first metal layer 121, the third metal layer 125, the fifth metal layer 129, and the seventh metal layer 133 include the first metal material, and the second metal layer 123, the fourth metal layer 127, and the sixth metal layer 131 include the second metal material different from the first metal material. In some embodiments, the melting point of the second metal material is higher than the melting point of the first metal material. In some embodiments, the first metal material includes aluminum (Al), and the second metal material includes copper (Cu). However, these materials are merely exemplary. Any other suitable materials may alternatively be used to from the first metal layer 121, the second metal layer 123, the third metal layer 125, the fourth metal layer 127, the fifth metal layer 129, the sixth metal layer 131, and the seventh metal layer 133.

In some embodiments, the first metal layer 121, the second metal layer 123, the third metal layer 125, the fourth metal layer 127, the fifth metal layer 129, the sixth metal layer 131, and the seventh metal layer 133 are formed by a plurality of deposition processes, such as chemical vapor deposition (CVD) processes, physical vapor deposition (PVD) processes, atomic layer deposition (ALD) processes, spin-on coating processes. After the deposition processes are performed, a planarization process may be performed to remove excess portions of the metal materials disposed over the top surface 105T of the second dielectric layer 105. The planarization process may be a chemical mechanical polishing (CMP) process.

It should be noted that, although there are four layers of first metal material (i.e., the first metal layer 121, the third metal layer 125, the fifth metal layer 129 and the seventh metal layer 133) and three layers of second metal material (i.e., the second metal layer 123, the fourth metal layer 127 and the sixth metal layer 131) shown in FIG. 6, the number of the layers of first metal material and the number of the layers of second metal material are not limited herein, depending on the demands of the manufacturing process and on performance requirements. For example, the number of the layers of first metal material is three and the number of the layers of second metal material is two, in accordance with some embodiments. That is, the sixth metal layer 131 and the seventh metal layer 133 can be omitted. In this case, the top surface of the fifth metal layer 129 is substantially coplanar with the top surface 105T of the second dielectric layer 105. In some other embodiments, the number of the layers of first metal material and the number of the layers of second metal material can be more than the present embodiment.

Figure 7:
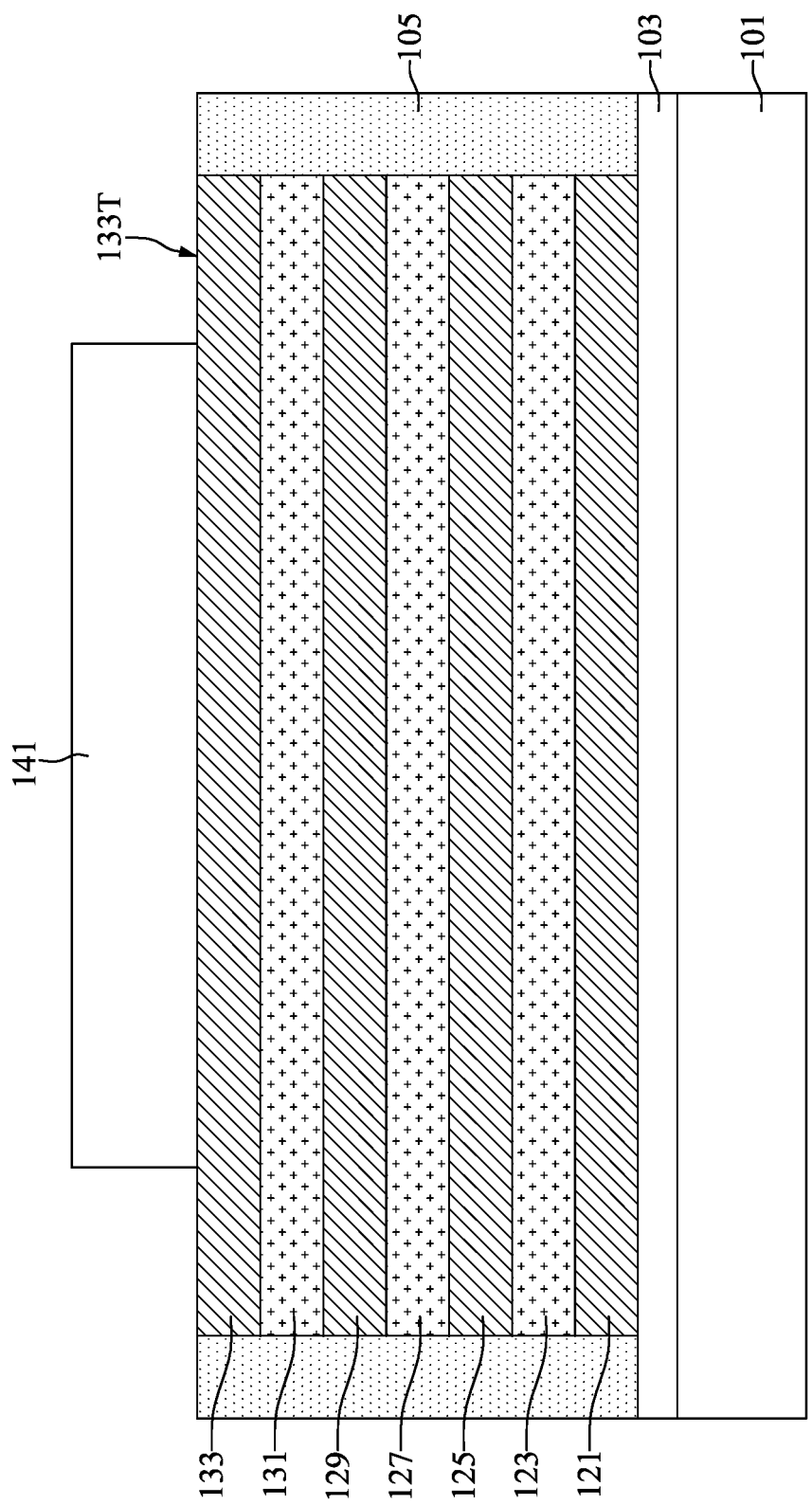
FIG. 7 is a cross-sectional illustrating an intermediate stage of forming a patterned photo resist over the metal layers during the formation of the semiconductor device, in accordance with some embodiments.

Then, a patterned photo resist 141 is formed over the top surface 133T of the seventh metal layer 133, as shown in FIG. 7 in accordance with some embodiments. In some embodiments, the top surface 133T of the seventh metal layer 133 is partially exposed by the patterned photo resist 141.

Figure 8:
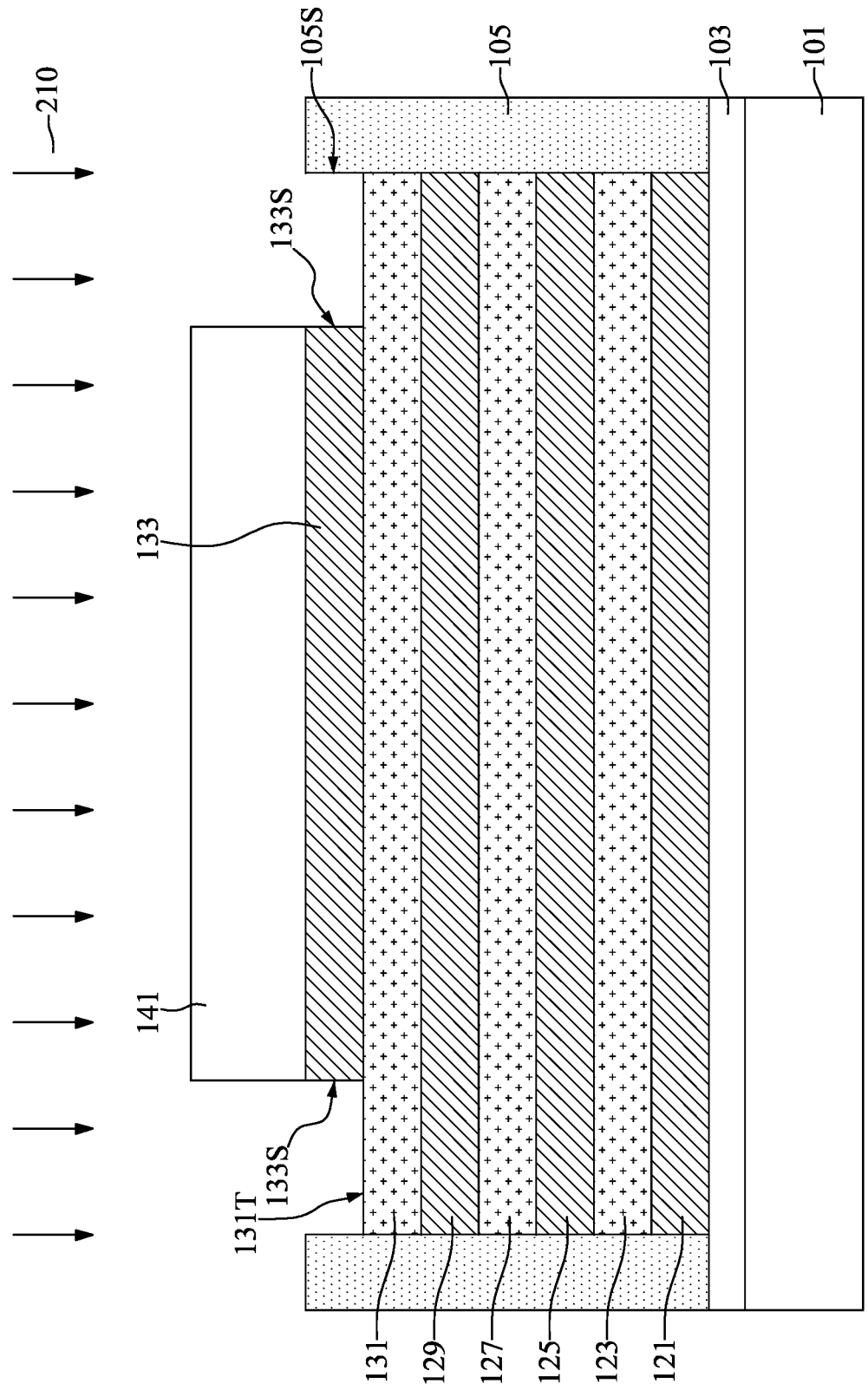
FIG. 8 is a cross-sectional illustrating an intermediate stage of performing a dry etching process using the patterned photo resist of FIG. 7 as a mask during the formation of the semiconductor device, in accordance with some embodiments.

Next, a dry etching process 210 is performed using the patterned photo resist 141 as a mask, such that the seventh metal material 135 is partially removed, as shown in FIG. 8 in accordance with some embodiments. In some embodiments, after the dry etching process 210 is performed, the sidewalls 133S of the seventh metal layer 133 are exposed. In addition, since the material of the seventh metal layer 133 has an etch selectivity with respect to the material of the sixth metal layer 131 during the dry etching process, the sixth metal layer 131 is substantially intact. As a result, the top surface 131T of the sixth metal layer 131 and the sidewalls 105S of the second dielectric layer 105 are partially exposed after the dry etching process 210 is performed, in accordance with some embodiments.

Figure 9:
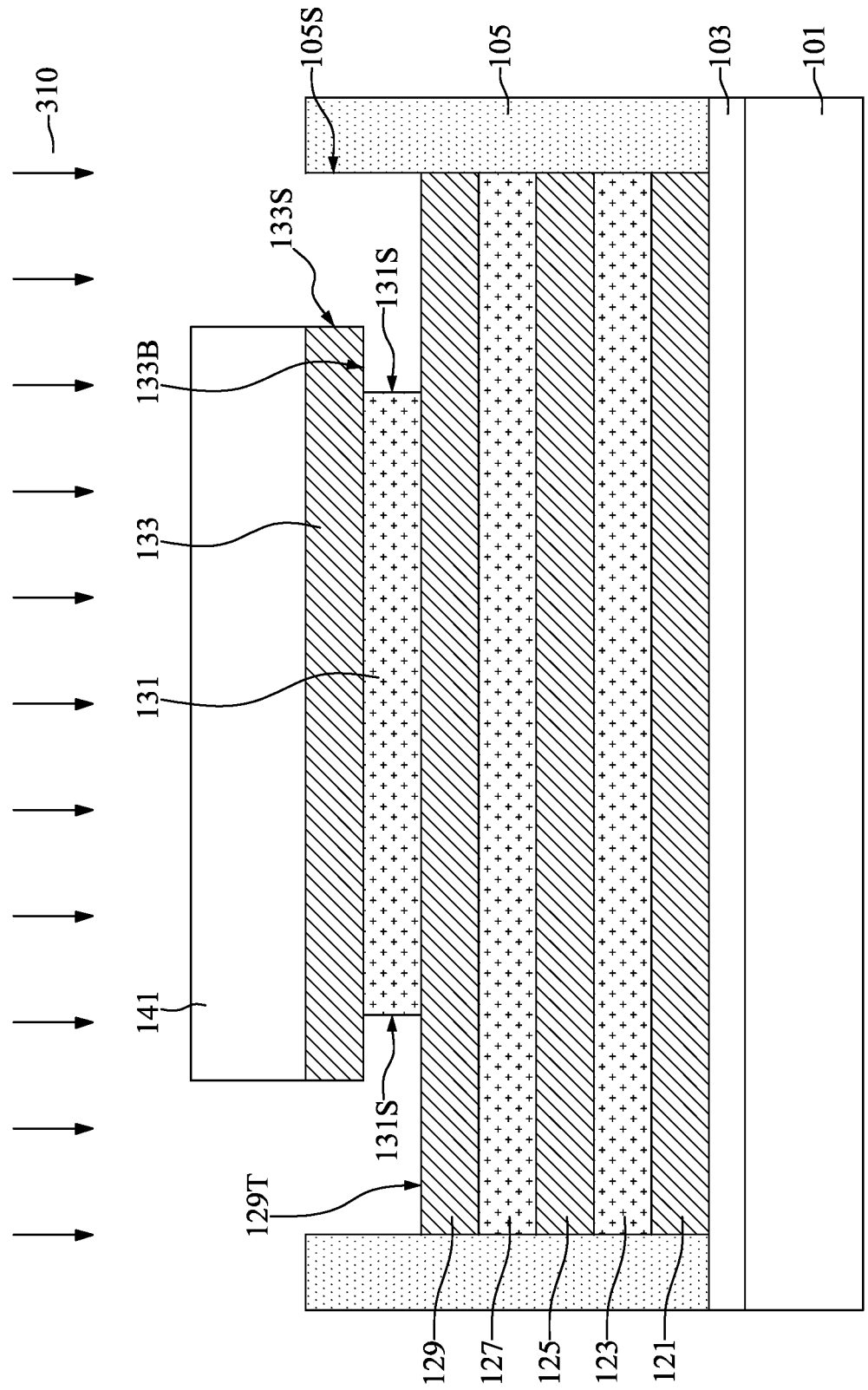
FIG. 9 is a cross-sectional illustrating an intermediate stage of performing a wet etching process during the formation of the semiconductor device, in accordance with some embodiments.

Subsequently, a wet etching process 310 is performed to partially remove the sixth metal layer 131, as shown in FIG. 9 in accordance with some embodiments. Since the material of the sixth metal layer 131 has an etch selectivity with respect to the materials of the seventh metal layer 133 and the fifth metal layer 129 during the wet etching process, the seventh metal layer 133 and the fifth metal layer 129 are substantially intact.

In some embodiments, after the wet etching process 310 is performed, the sidewalls 131S of the sixth metal layer 131 are exposed. Moreover, the bottom surface 133B of the seventh metal layer 133 and the top surface 129T of the fifth metal layer 129 are partially exposed after the wet etching process 310 is performed, in accordance with some embodiments. After the wet etching process 310 is performed, the patterned photo resist 141 can be removed.

Figure 10:
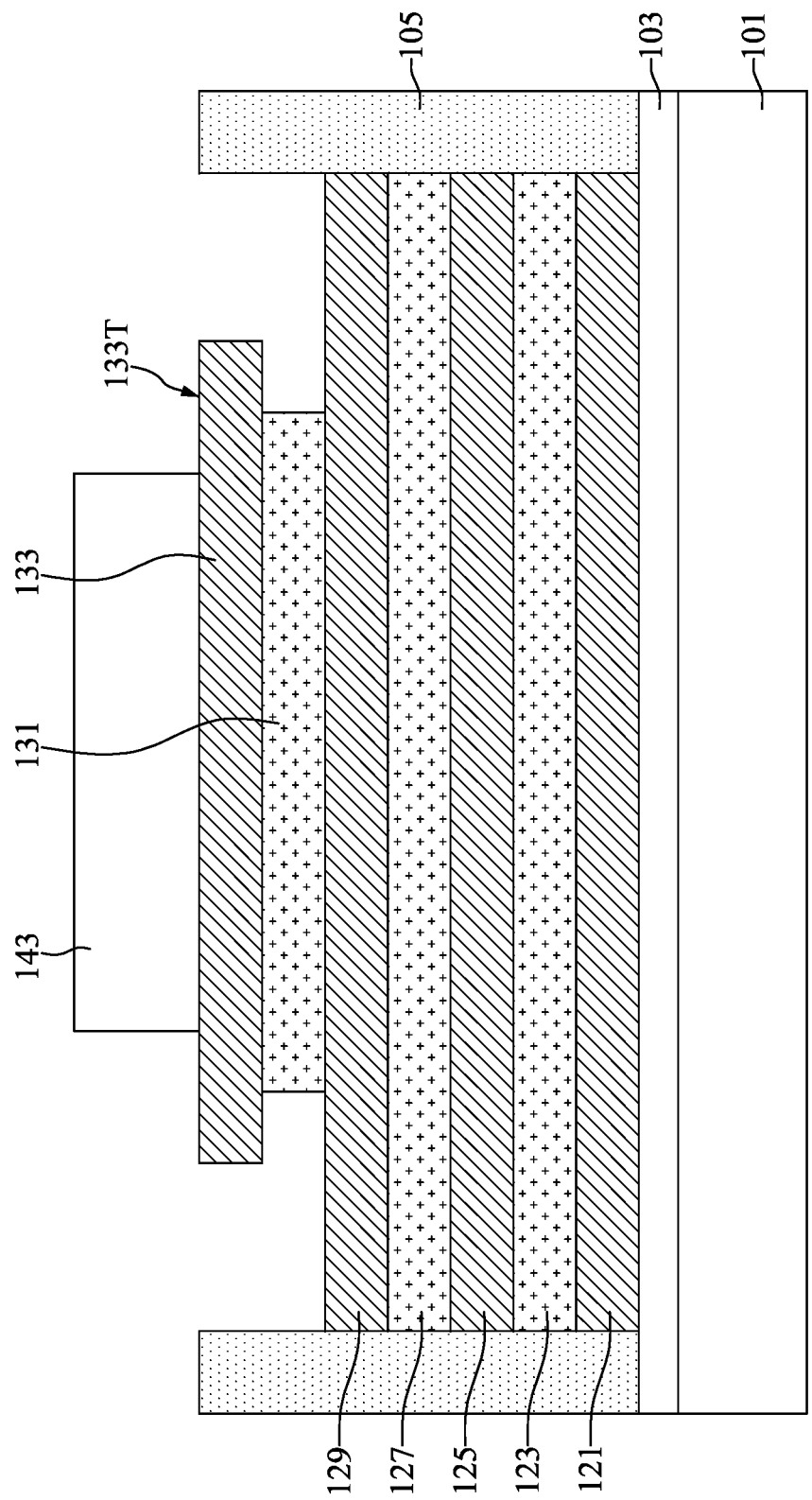
FIG. 10 is a cross-sectional illustrating an intermediate stage of forming a patterned photo resist over the metal layers during the formation of the semiconductor device, in accordance with some embodiments.

Then, a patterned photo resist 143 is formed over the top surface 133T of the seventh metal layer 133, as shown in FIG. 10 in accordance with some embodiments. In some embodiments, the top surface 133T of the seventh metal layer 133 is partially exposed by the patterned photo resist 143.

Figure 11:
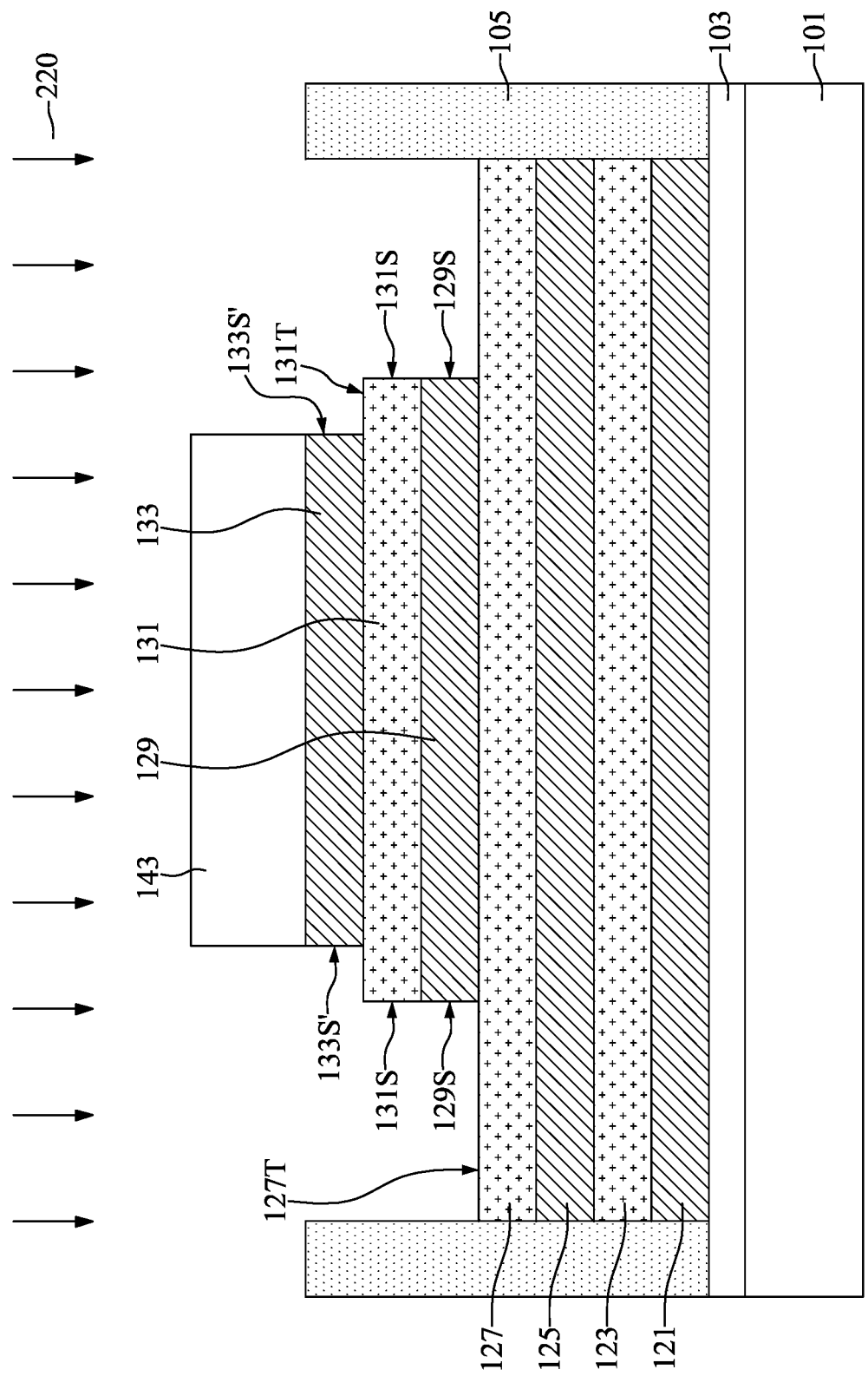
FIG. 11 is a cross-sectional illustrating an intermediate stage of performing a dry etching process using the patterned photo resist of FIG. 10 as a mask during the formation of the semiconductor device, in accordance with some embodiments.

Next, a dry etching process 220 is performed using the patterned photo resist 143 as a mask, such that the seventh metal layer 133 and the fifth metal layer 129 are partially removed, as shown in FIG. 11 in accordance with some embodiments. In some embodiments, after the dry etching process 220 is performed, the sidewalls 133S' of the seventh metal layer 133 and the sidewalls 129S of the fifth metal layer 129 are exposed. In addition, since the materials of the seventh metal layer 133 and the fifth metal layer 129 have etch selectivities with respect to the materials of the sixth metal layer 131 and the fourth metal layer 127 during the dry etching process, the sixth metal layer 131 and the fourth metal layer 127 are substantially intact. As a result, the top surface 127T of the fourth metal layer 127 is partially exposed after the dry etching process 220 is performed, in accordance with some embodiments.

Figure 12:
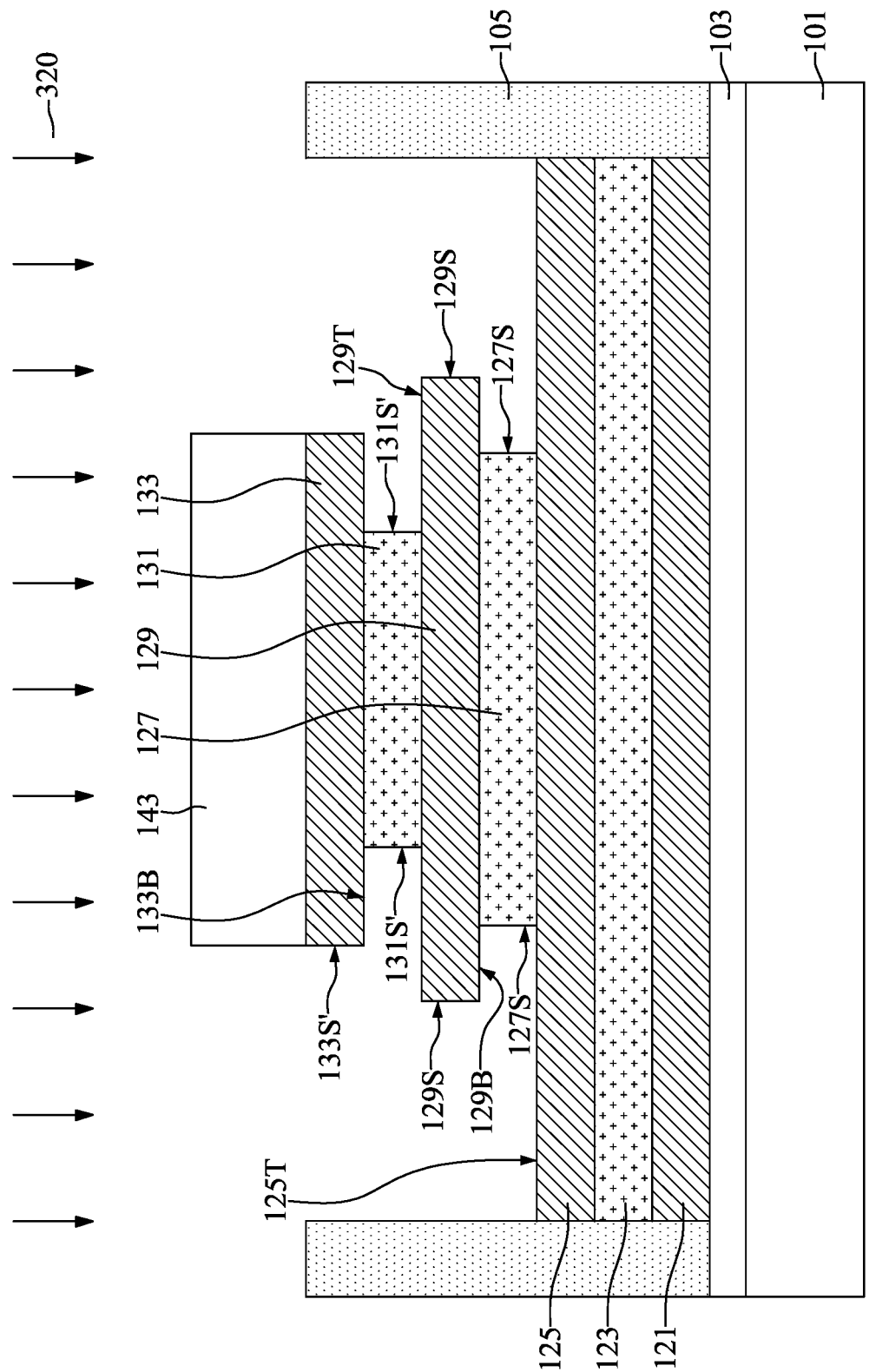
FIG. 12 is a cross-sectional illustrating an intermediate stage of performing a wet etching process during the formation of the semiconductor device, in accordance with some embodiments.

Subsequently, a wet etching process 320 is performed to partially remove the sixth metal layer 131 and the fourth metal layer 127, as shown in FIG. 12 in accordance with some embodiments. Since the materials of the sixth metal layer 131 and the fourth metal layer 127 have etch selectivities with respect to the materials of the seventh metal layer 133, the fifth metal layer 129 and the third metal layer 125 during the wet etching process, the seventh metal layer 133, the fifth metal layer 129 and the third metal layer 125 are substantially intact.

In some embodiments, after the wet etching process 320 is performed, the sidewalls 131S' of the sixth metal layer 131 and the sidewalls 127S of the fourth metal layer 127 are exposed. Moreover, the bottom surface 133B of the seventh metal layer 133, the bottom surface 129B of the fifth metal layer 129, and the top surface 125T of the third metal layer 125 are partially exposed after the wet etching process 320 is performed, in accordance with some embodiments. After the wet etching process 320 is performed, the patterned photo resist 143 can be removed.

Figure 13:
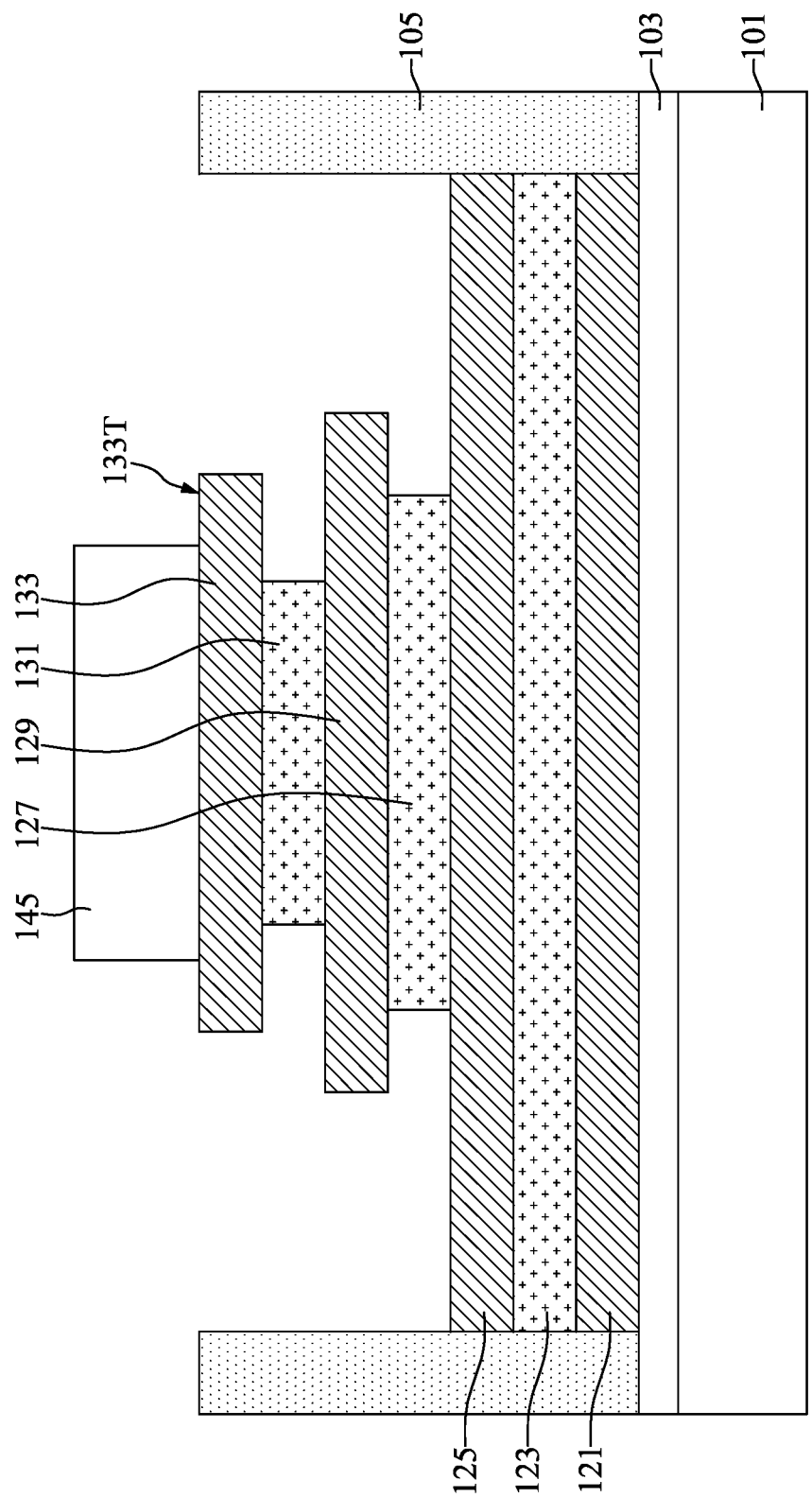
FIG. 13 is a cross-sectional illustrating an intermediate stage of forming a patterned photo resist over the metal layers during the formation of the semiconductor device, in accordance with some embodiments.

Then, a patterned photo resist 145 is formed over the top surface 133T of the seventh metal layer 133, as shown in FIG. 13 in accordance with some embodiments. In some embodiments, the top surface 133T of the seventh metal layer 133 is partially exposed by the patterned photo resist 145.

Figure 14:
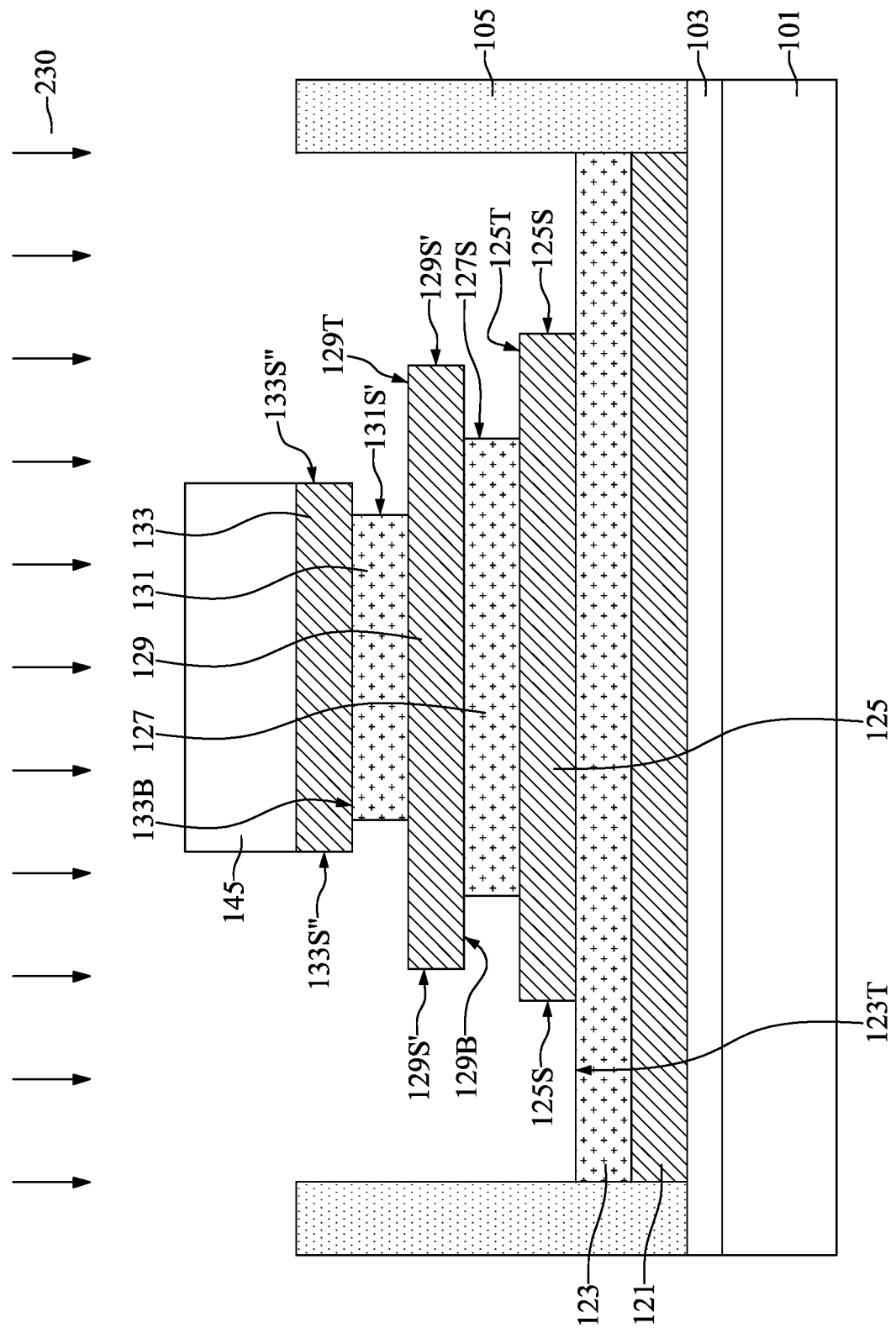
FIG. 14 is a cross-sectional illustrating an intermediate stage of performing a dry etching process using the patterned photo resist of FIG. 13 as a mask during the formation of the semiconductor device, in accordance with some embodiments.

Next, a dry etching process 230 is performed using the patterned photo resist 145 as a mask, such that the seventh metal layer 133, the fifth metal layer 129 and the third metal layer 125 are partially removed, as shown in FIG. 14 in accordance with some embodiments. In some embodiments, after the dry etching process 230 is performed, the sidewalls 133S" of the seventh metal layer 133, the sidewalls 129S' of the fifth metal layer 129, and the sidewalls 125S of the third metal layer 125 are exposed. In addition, since the materials of the seventh metal layer 133, the fifth metal layer 129 and the third metal layer 125 have etch selectivities with respect to the materials of the sixth metal layer 131, the fourth metal layer 127 and the second metal layer 123 during the dry etching process, the sixth metal layer 131, the fourth metal layer 127 and the second metal layer 123 are substantially intact. As a result, the top surface 123T of the second metal layer 123 is partially exposed after the dry etching process 230 is performed, in accordance with some embodiments.

Figure 15:
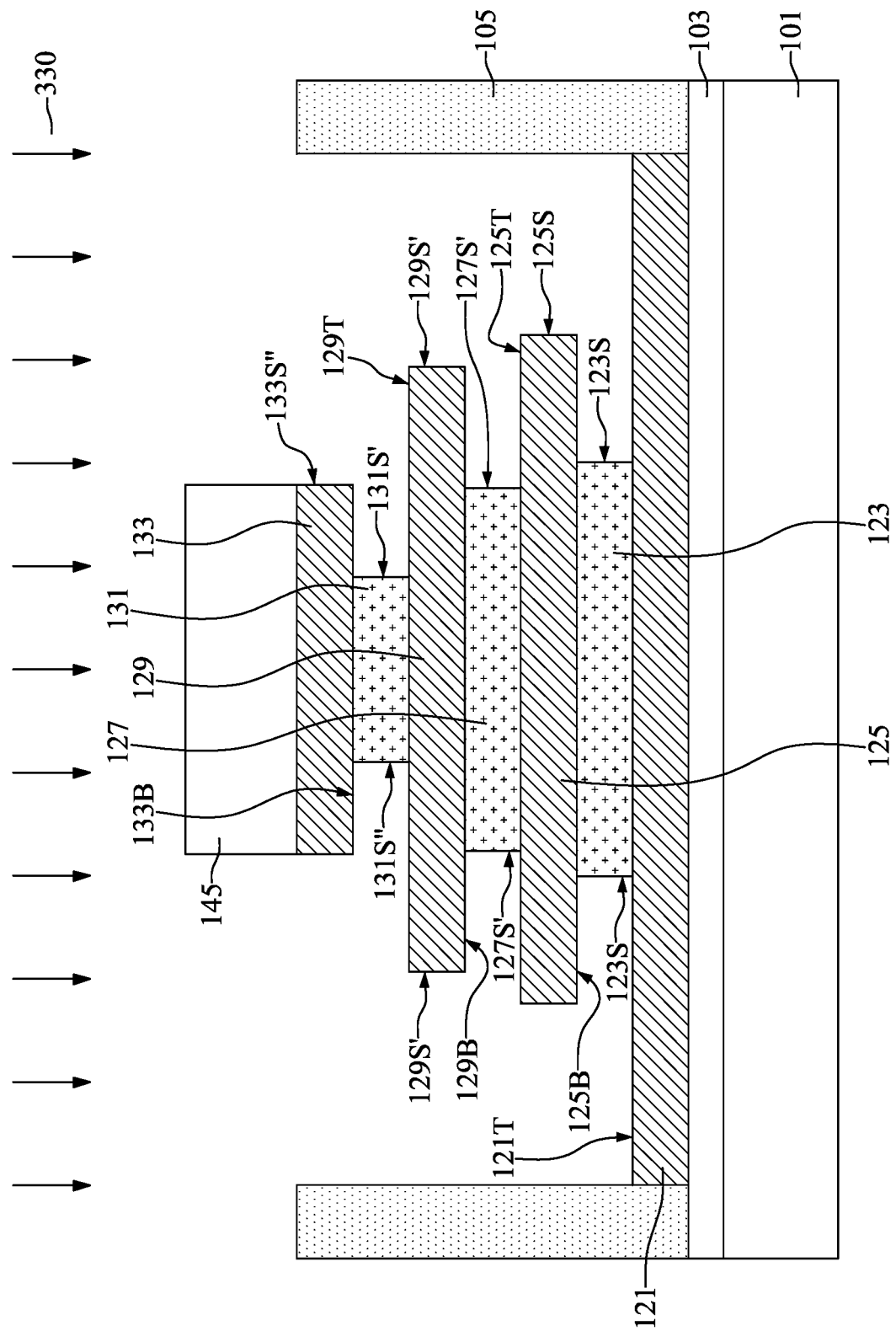
FIG. 15 is a cross-sectional illustrating an intermediate stage of performing a wet etching process during the formation of the semiconductor device, in accordance with some embodiments.

Subsequently, a wet etching process 330 is performed to partially remove the sixth metal layer 131, the fourth metal layer 127 and the second metal layer 123, as shown in FIG. 15 in accordance with some embodiments. Since the materials of the sixth metal layer 131, the fourth metal layer 127 and the second metal layer 123 have etch selectivities with respect to the materials of the seventh metal layer 133, the fifth metal layer 129, the third metal layer 125 and the first metal layer 121 during the wet etching process, the seventh metal layer 133, the fifth metal layer 129, the third metal layer 125 and the first metal layer 121 are substantially intact.

In some embodiments, after the wet etching process 330 is performed, the sidewalls 131S" of the sixth metal layer 131, the sidewalls 127S' of the fourth metal layer 127, and the sidewalls 123S of the second metal layer 123 are exposed. Moreover, the bottom surface 133B of the seventh metal layer 133, the bottom surface 129B of the fifth metal layer 129, the bottom surface 125B of the third metal layer 125, and the top surface 121T of the first metal layer 121 are partially exposed after the wet etching process 330 is performed, in accordance with some embodiments. After the wet etching process 330 is performed, the patterned photo resist 145 can be removed.

Figure 16:
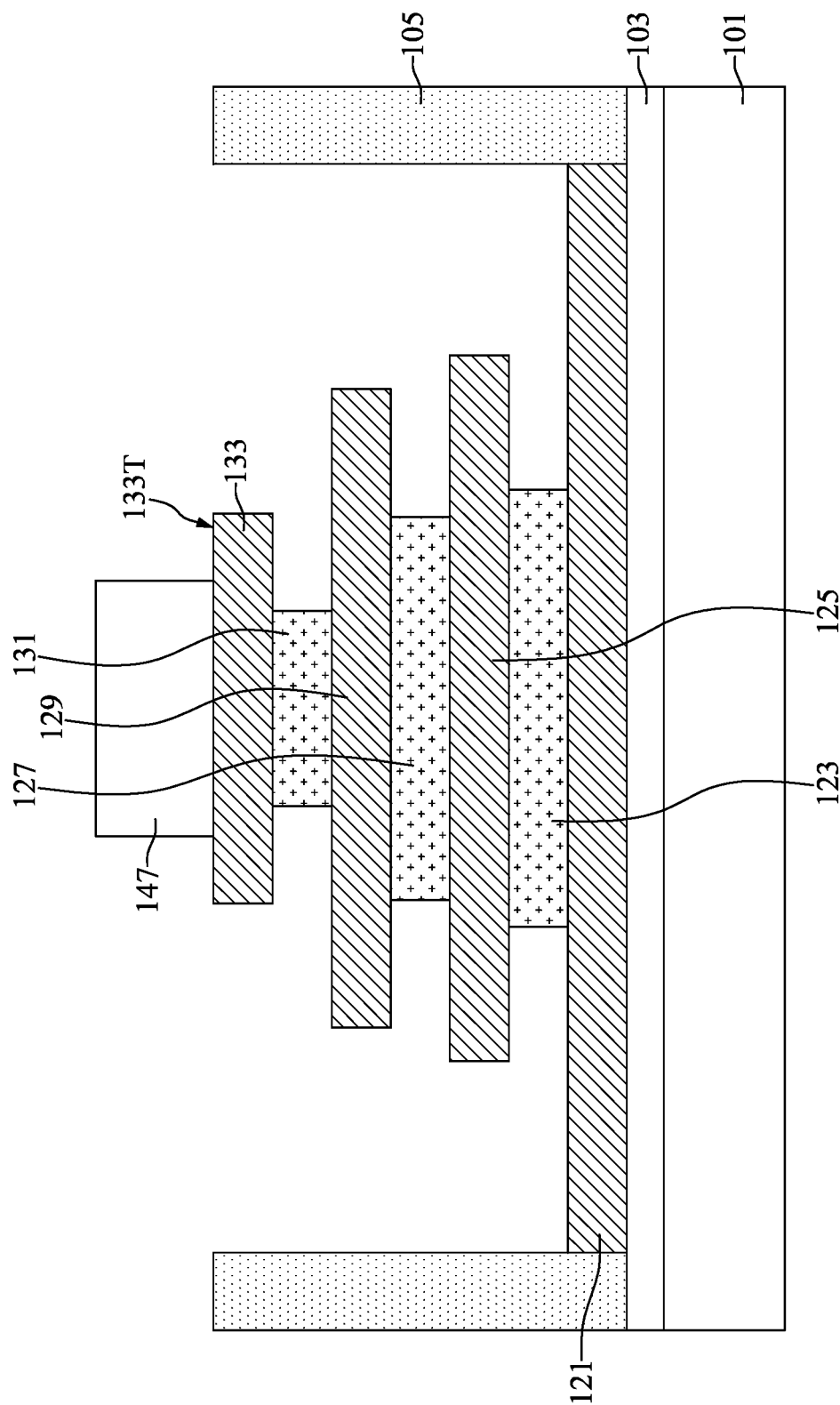
FIG. 16 is a cross-sectional illustrating an intermediate stage of forming a patterned photo resist over the metal layers during the formation of the semiconductor device, in accordance with some embodiments.

Then, a patterned photo resist 147 is formed over the top surface 133T of the seventh metal layer 133, as shown in FIG. 16 in accordance with some embodiments. In some embodiments, the top surface 133T of the seventh metal layer 133 is partially exposed by the patterned photo resist 147.

Figure 17:
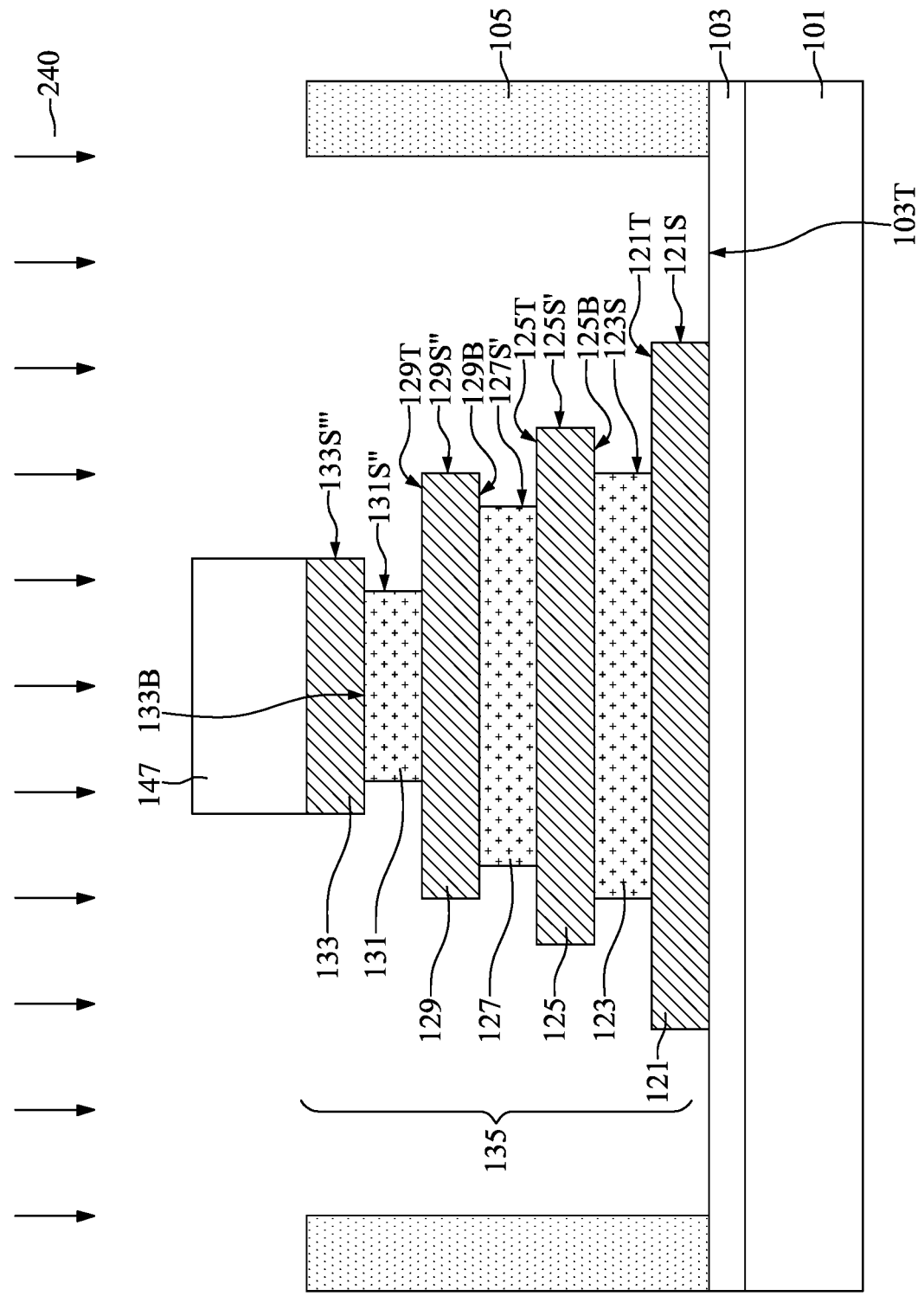
FIG. 17 is a cross-sectional illustrating an intermediate stage of performing a dry etching process using the patterned photo resist of FIG. 16 as a mask to form a bottom electrode structure during the formation of the semiconductor device, in accordance with some embodiments.

Next, a dry etching process 240 is performed using the patterned photo resist 147 as a mask, such that the seventh metal layer 133, the fifth metal layer 129, the third metal layer 125 and the first metal layer 121 are partially removed, as shown in FIG. 17 in accordance with some embodiments. In some embodiments, after the dry etching process 240 is performed, the sidewalls 133S''' of the seventh metal layer 133, the sidewalls 129S" of the fifth metal layer 129, the sidewalls 125S' of the third metal layer 125, and the sidewalls 121S of the first metal layer 121 are exposed.

In addition, since the materials of the seventh metal layer 133, the fifth metal layer 129, the third metal layer 125 and the first metal layer 121 have etch selectivities with respect to the materials of the sixth metal layer 131, the fourth metal layer 127 and the second metal layer 123 during the dry etching process, the sixth metal layer 131, the fourth metal layer 127 and the second metal layer 123 are substantially intact. In some embodiments, the top surface 103T of the first dielectric layer 103 is partially exposed after the dry etching process 240 is performed, in accordance with some embodiments.

After the dry etching process 240 is performed, a bottom electrode 135 including the first metal layer 121, the second metal layer 123, the third metal layer 125, the fourth metal layer 127, the fifth metal layer 129, the sixth metal layer 131 and the seventh metal layer 133 are obtained. The respective step is illustrated as the step S19 in the method 10 shown in FIG. 3. In some embodiments, the sidewalls of the bottom electrode structure 135 are step-shaped. After the top surface 103T of the first dielectric layer 103 is partially exposed, the patterned mask 147 may be removed.

Figure 18:
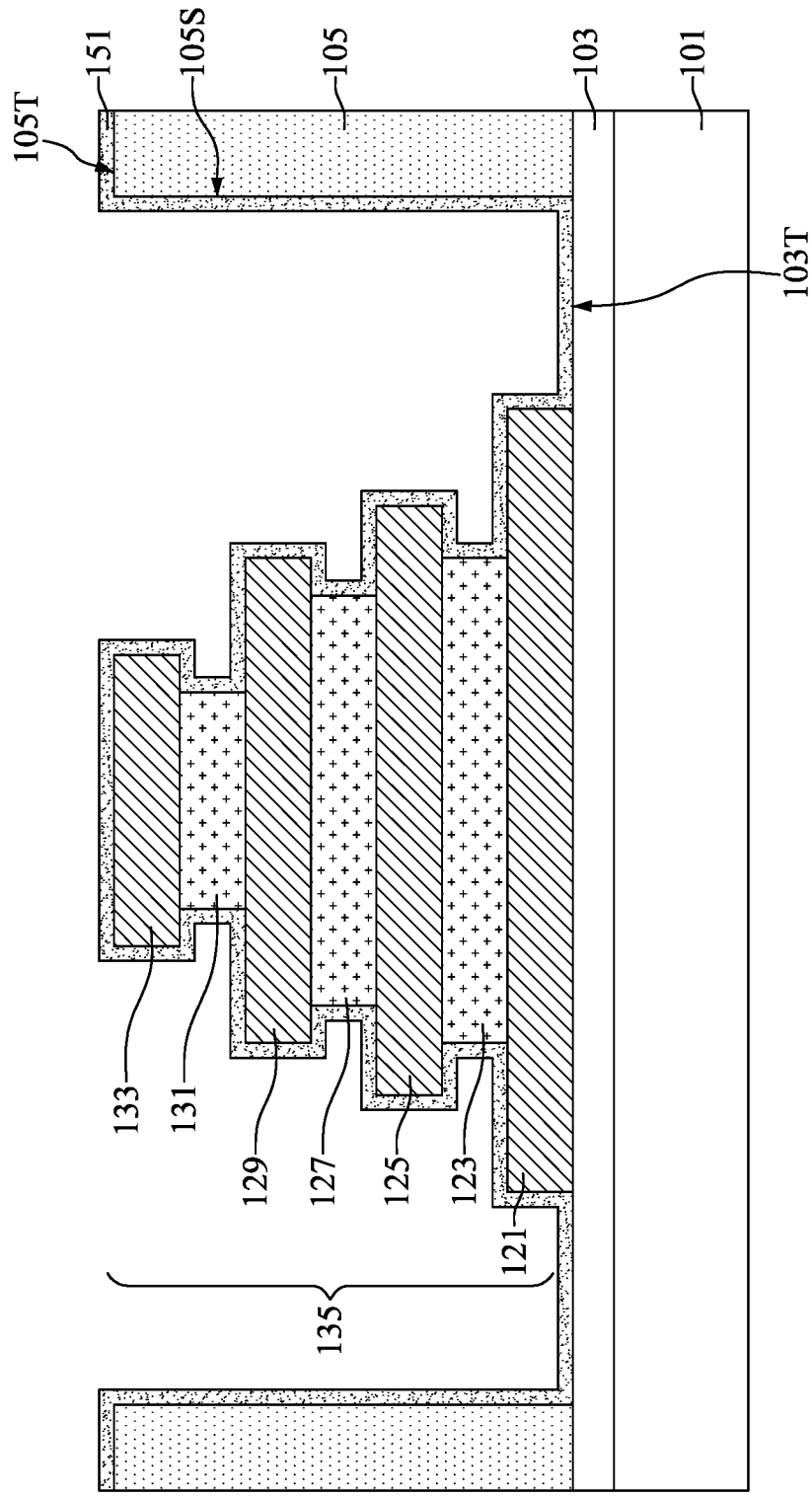
FIG. 18 is a cross-sectional illustrating an intermediate stage of forming a high-k dielectric layer over the structure of FIG. 17 during the formation of the semiconductor device, in accordance with some embodiments.

Subsequently, a high-k dielectric layer 151 is conformally formed over the structure of FIG. 17, as shown in FIG. 18 in accordance with some embodiments. In some embodiments, the bottom electrode structure 135 is covered by the high-k dielectric layer 151. Moreover, in some embodiments, the top surface 103T of the first dielectric layer 103, and the sidewalls 105S and the top surface 105T of the second dielectric layer 105 are covered by and in direct contact with the high-k dielectric layer 151. The respective step is illustrated as the step S21 in the method 10 shown in FIG. 3.

In some embodiments, the high-k dielectric layer 151 includes a high-k dielectric material such as hafnium oxide, lanthanum oxide, aluminum oxide, zirconium oxide, or the like. In addition, the high-k dielectric layer 151 may be deposited by a conformal deposition process, such as a CVD process, an ALD process, a plasma-enhanced CVD (PECVD) process, another suitable process, or a combination thereof.

Figure 19:
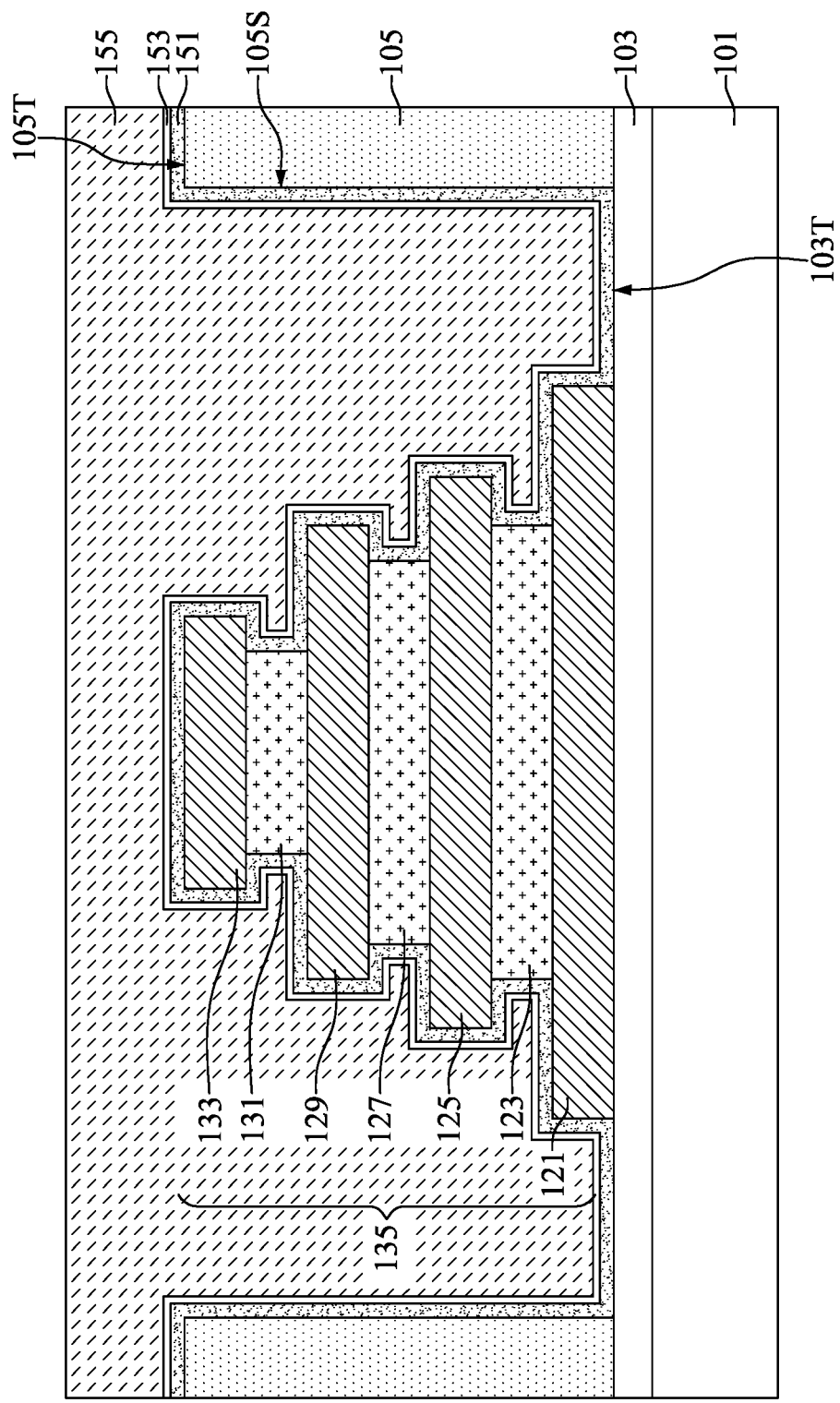
FIG. 19 is a cross-sectional illustrating an intermediate stage of sequentially forming a seed layer and a conductive layer over the high-k dielectric layer during the formation of the semiconductor device, in accordance with some embodiments.

Then, a seed layer 153 and a conductive layer 155 are sequentially formed over the high-k dielectric layer 151, as shown in FIG. 19 in accordance with some embodiments. The respective step is illustrated as the step S23 in the method 10 shown in FIG. 3. In some embodiments, the seed layer 153 includes an alloy of titanium (Ti) and copper (Cu), and may be formed by a CVD process, a PVD process, a sputtering process, a plating process, or another suitable process. In some embodiments, the conductive layer 155 includes a low resistivity conductive material, such as copper (Cu). In some other embodiments, the conductive layer 155 includes tungsten (W), aluminum (Al), titanium (Ti), tantalum (Ta), gold (Au), silver (Ag), a combination thereof, or another suitable conductive material. The conductive layer 155 may be formed by a CVD process, a PVD process, a sputtering process, a plating process, or another suitable process.

Figure 20:
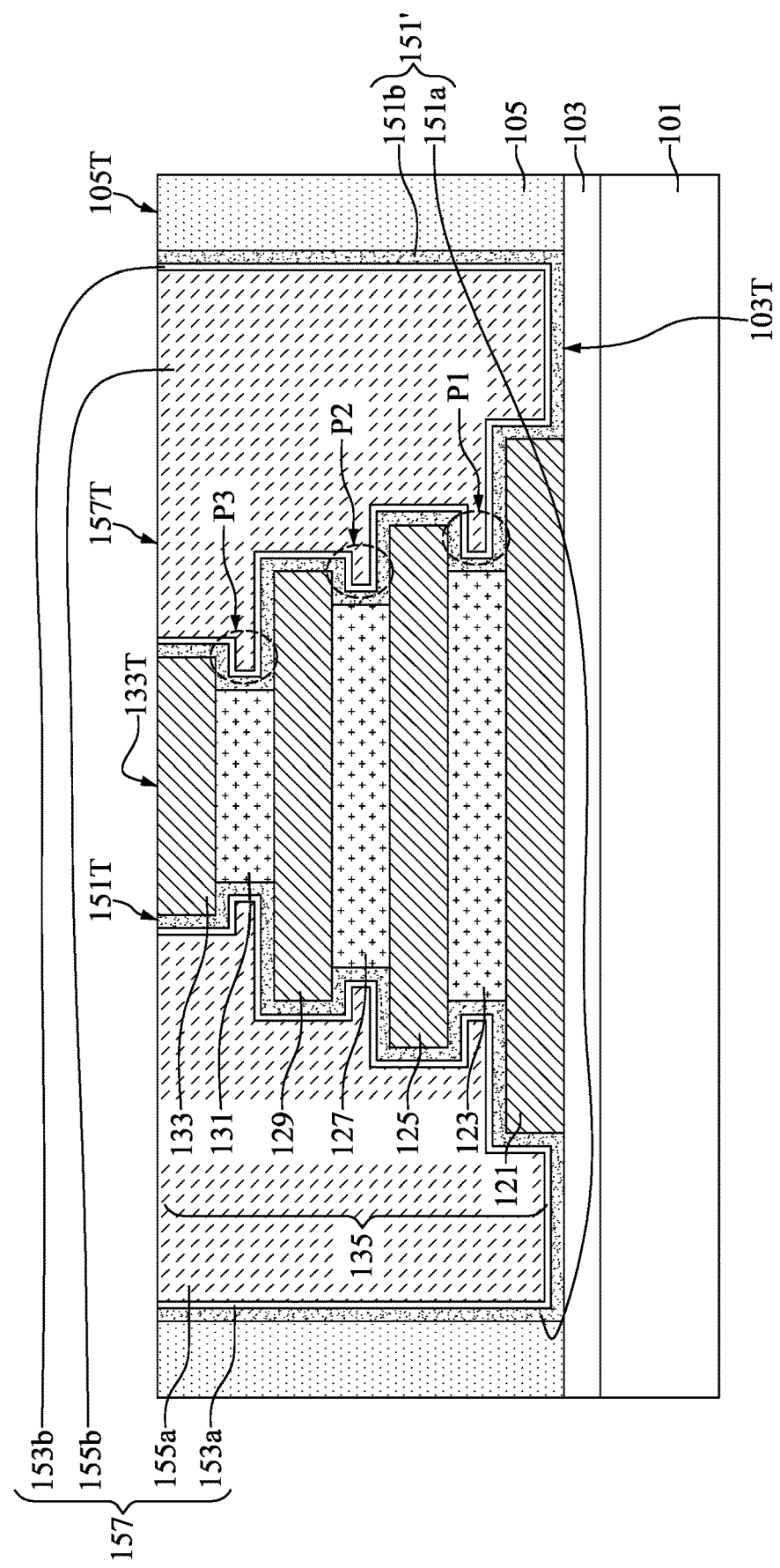
FIG. 20 is a cross-sectional illustrating an intermediate stage of performing a planarization process on the conductive layer, the seed layer, and the high-k dielectric layer to form a top electrode structure and a high-k dielectric structure during the formation of the semiconductor device, in accordance with some embodiments.

After the conductive layer 155 is formed, a planarization process is performed on the conductive layer 155, the seed layer 153 and the high-k dielectric layer 151 to form a top electrode structure 157 and a high-k dielectric structure 151', as shown in FIG. 20 in accordance with some embodiments. The planarization process may include a CMP process, which removes the excess portions of the conductive layer 155, the seed layer 153 and the high-k dielectric layer 151 over the top surface 105T of the second dielectric layer 105.

In some embodiments, after the planarization process is performed, the remaining portions of the high-k dielectric layer 151 are referred to as high-k dielectric portions 151a and 151b, the remaining portions of the seed layer 153 are referred to as seed portions 153a and 153b, and the remaining portions of the conductive layer 155 are referred to as conductive portions 155a and 155b. In some embodiments, the high-k dielectric portions 151a and 151b collectively form the high-k dielectric structure 151'. In some embodiments, the seed portions 153a, 153b and the conductive portions 155a, 155b collectively form the top electrode structure 157.

In some embodiments, the top electrode structure 157 has a portion P1 extends between the first metal layer 121 and the third metal layer 125 of the bottom electrode structure 135. In some embodiments, the top electrode structure 157 has a portion P2 extends between the third metal layer 125 and the fifth metal layer 129 of the bottom electrode structure 135. In some embodiments, the top electrode structure 157 has a portion P3 extends between the fifth metal layer 129 and the seventh metal layer 133 of the bottom electrode structure 135.

The top surface 133T of the seventh metal layer 133 is also referred to as the top surface of the bottom electrode structure 135. In some embodiments, the top surface of the bottom electrode structure 135 is exposed after planarization process is performed. Moreover, the top surface of the bottom electrode structure 135 (i.e., the top surface 133T), the top surface 151T of the high-k dielectric structure 151', the top surface 157T of the top electrode structure 157, and the top surface 105T of the second dielectric layer 105 are substantially coplanar with each other, in accordance with some embodiments. The respective step is illustrated as the step S25 in the method 10 shown in FIG. 3.

Figure 21:
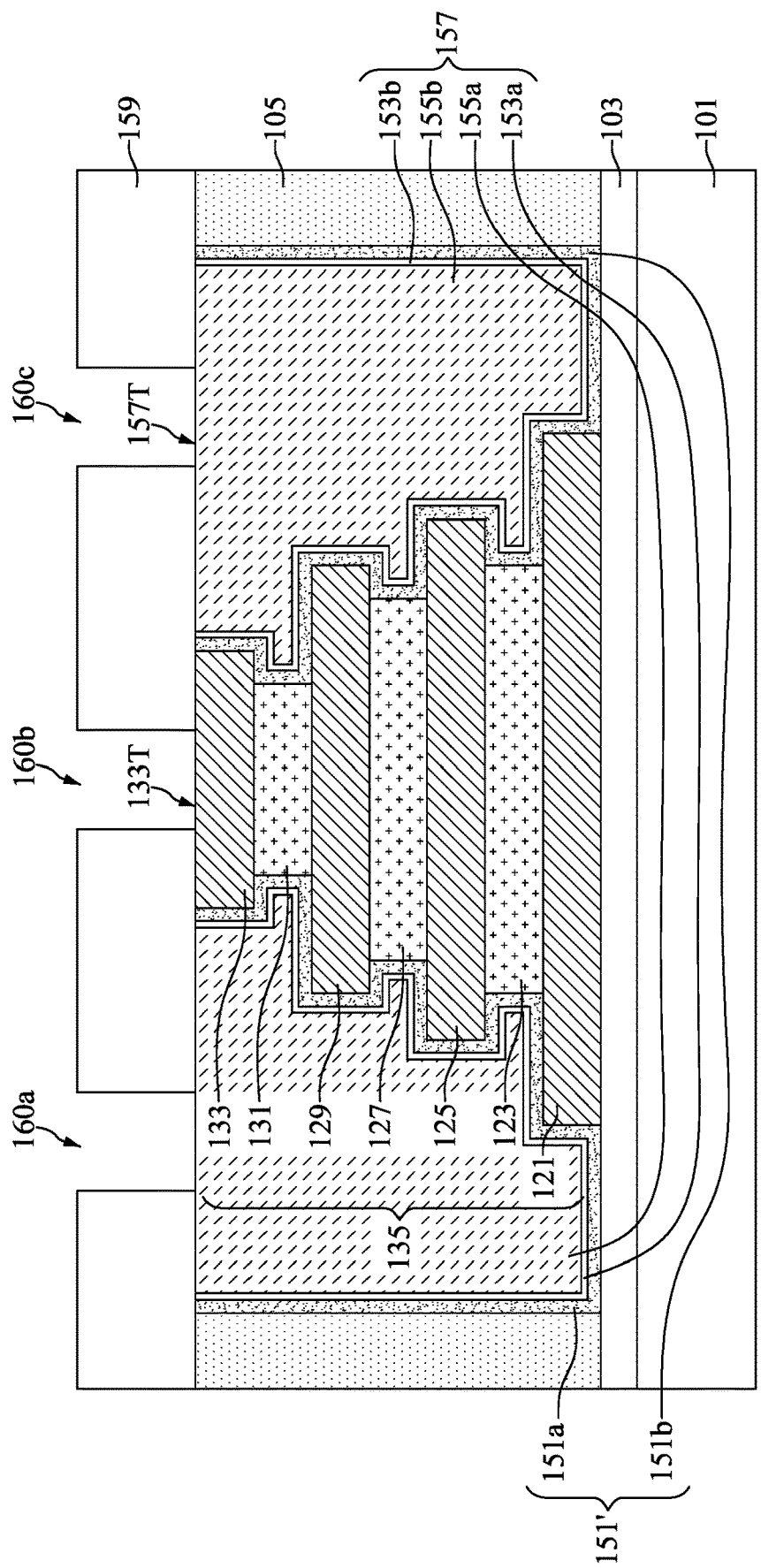
FIG. 21 is a cross-sectional illustrating an intermediate stage of forming a third dielectric layer over the structure of FIG. 20 during the formation of the semiconductor device, in accordance with some embodiments.

Next, a third dielectric layer 159 with a plurality of openings 160a, 160b and 160c is formed over the structure of FIG. 20, as shown in FIG. 21 in accordance with some embodiments. In some embodiments, the top surface 157T of the top electrode structure 157 is partially exposed by the openings 160a and 160c, and the top surface 133T of the bottom electrode structure 135 is partially exposed by the opening 160b. In some embodiments, the third dielectric layer 159 includes silicon oxide, silicon nitride, silicon oxynitride, or another suitable dielectric material.

The formation of the third dielectric layer 159 with the openings 160a, 160b and 160c may include depositing the third dielectric layer 159 covering the second dielectric layer 105, the top electrode structure 157 and the bottom electrode structure 135, forming a patterned mask (not shown) over the third dielectric layer 159, performing an etching process on the third dielectric layer 159 using the patterned mask as an etching mask, and removing the patterned mask. In some embodiments, the etching process for forming the openings 160a, 160b and 160c includes a dry etching process, a wet etching process, or a combination thereof.

Subsequently, conductive plugs 163a, 163b and 163c are formed in the openings 160a, 160b and 160c, respectively, and conductive pads 165a, 165b and 165c are formed over the top surface 159T of the third dielectric layer 159, as shown in FIG. 1 in accordance with some embodiments. In some embodiments, the conductive plugs 163a, 163b and 163c include a conductive material, such as copper (Cu), lithium (Li), aluminum (Al), tungsten (W), titanium (Ti), titanium nitride (TiN), tantalum (Ta), tantalum nitride (TaN), or another suitable material. In some embodiments, the conductive plugs 163a, 163b and 163c are formed by a deposition process and a subsequent planarization process. The deposition process may include a CVD process, a PVD process, an ALD process, another suitable process, or a combination thereof. The planarization process may include a CMP process.

Some materials used to form the conductive pads 165a, 165b and 165c are similar to, or the same as, those used to form the conductive plugs 163a, 163b and 163c, and details thereof are not repeated herein. The formation of the conductive pads 165a, 165b and 165c may include depositing a conductive layer (not shown) over the third dielectric layer 159, forming a patterned mask (not shown) over the conductive layer, performing an etching process on the conductive layer using the patterned mask as an etching mask, and removing the patterned mask. The etching process may include a dry etching process, a wet etching process, or a combination thereof. After the conductive pads 165a, 165b and 165c are formed, the semiconductor device 100 is obtained.

Embodiments of the semiconductor device 100 with the bottom electrode 135 having step-shaped sidewalls and method for preparing the same are provided in the disclosure. The semiconductor device 100 includes the bottom electrode structure 135, the high-k dielectric structure 151' disposed on opposite sidewalls (i.e., the sidewalls 121S, 123S, 125S, 127S, 129S, 131S and 133S) of the bottom electrode structure 135, and the top electrode structure 157 laterally surrounding the bottom electrode structure 135 and separated from the bottom electrode structure 135 by the high-k dielectric structure 151'. In some embodiments, the opposite sidewalls of the bottom electrode structure 135 are step-shaped. Therefore, the effective area of the capacitor formed by the bottom electrode structure 135, the high-k dielectric structure 151', and the top electrode structure 157 can be increased within the same footprint area, and the capacitance per unit area can be increased. As a result, the performance of the semiconductor device 100 can be improved.

In one embodiment of the present disclosure, a semiconductor device is provided. The semiconductor device includes a bottom electrode structure disposed over a semiconductor substrate. The bottom electrode structure includes a first metal layer, a second metal layer disposed over the first metal layer, a third metal layer disposed over the second metal layer, a fourth metal layer disposed over the third metal layer, and a fifth metal layer disposed over the fourth metal layer. The first metal layer, the third metal layer and the fifth metal layer include a first metal material, and the second metal layer and the fourth metal layer include a second metal material different from the first metal material. The semiconductor device also includes a high-k dielectric structure disposed on opposite sidewalls of the bottom electrode structure. The opposite sidewalls of the bottom electrode structure are step-shaped. The semiconductor device further includes a top electrode structure laterally surrounding the bottom electrode structure and separated from the bottom electrode structure by the high-k dielectric structure.

In another embodiment of the present disclosure, a semiconductor device is provided. The semiconductor device includes a bottom electrode structure disposed over a semiconductor substrate. The bottom electrode structure includes a first metal layer, a second metal layer disposed over the first metal layer, a third metal layer disposed over the second metal layer, a fourth metal layer disposed over the third metal layer, and a fifth metal layer disposed over the fourth metal layer. The first metal layer, the third metal layer and the fifth metal layer include a first metal material, and the second metal layer and the fourth metal layer include a second metal material different from the first metal material. The first metal layer has a first width, the second metal layer has a second width, and the third metal layer has a third width, the first width is greater than the third width, and the third width is greater than the second width. The semiconductor device also includes a high-k dielectric structure disposed on opposite sidewalls of the bottom electrode structure, and a top electrode structure laterally surrounding the bottom electrode structure and separated from the bottom electrode structure by the high-k dielectric structure.

In yet another embodiment of the present disclosure, a method for forming a semiconductor device is provided. The method includes forming a bottom electrode structure over a semiconductor substrate. The formation of the bottom electrode structure includes forming a first metal layer over the semiconductor substrate, forming a second metal layer over the first metal layer, forming a third metal layer over the second metal layer, forming a fourth metal layer over the third metal layer, and forming a fifth metal layer over the fourth metal layer. The first metal layer, the third metal layer and the fifth metal layer include a first metal material, and the second metal layer and the fourth metal layer include a second metal material different from the first metal material. The formation of the bottom electrode structure also includes performing a first dry etching process to partially remove the fifth metal layer, and performing a first wet etching process to partially remove the fourth metal layer after the first dry etching process is performed. The method also includes forming a high-k dielectric layer over the bottom electrode structure, and forming a conductive layer over the high-k dielectric layer. The method further includes performing a planarization process on the conductive layer and the high-k dielectric layer, such that a top electrode structure and a high-k dielectric structure are formed surrounding the bottom electrode structure.

The embodiments of the present disclosure have some advantageous features. By forming a bottom electrode structure having step-shaped sidewalls and a top electrode structure surrounding the bottom electrode structure, the effective area of a capacitor formed by the bottom electrode structure and the top electrode structure can be increased within the same footprint area, and the capacitance per unit area can be increased. As a result, the performance of the semiconductor device 100 can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a bottom electrode structure disposed over a semiconductor substrate, wherein the bottom electrode structure comprises:
a first metal layer;
a second metal layer disposed over the first metal layer;
a third metal layer disposed over the second metal layer;
a fourth metal layer disposed over the third metal layer; and
a fifth metal layer disposed over the fourth metal layer,
wherein the first metal layer, the third metal layer and the fifth metal layer comprise a first metal material, and the second metal layer and the fourth metal layer comprise a second metal material different from the first metal material;
a high-k dielectric structure disposed on opposite sidewalls of the bottom electrode structure, wherein the opposite sidewalls of the bottom electrode structure are step-shaped; and
a top electrode structure laterally surrounding the bottom electrode structure and separated from the bottom electrode structure by the high-k dielectric structure.

2. The semiconductor device of claim 1, wherein the first metal layer has a first width, the second metal layer has a second width, the third metal layer has a third width, the fourth metal layer has a fourth width, and the fifth metal layer has a fifth width,
wherein the first width is greater than the third width, and the third width is greater than the fifth width, and
wherein the second width is greater than the fourth width.

3. The semiconductor device of claim 2, wherein the third width is greater than the second width, and the fifth width is greater than the fourth width.

4. The semiconductor device of claim 1, wherein a portion of the top electrode structure extends between the first metal layer and the third metal layer.

5. The semiconductor device of claim 4, wherein another portion of the top electrode structure extends between the third metal layer and the fifth metal layer.

6. The semiconductor device of claim 1, wherein a top surface of the bottom electrode structure, a top surface of the high-k dielectric structure, and a top surface of the top electrode structure are substantially coplanar with each other.

7. The semiconductor device of claim 1, wherein a melting point of the second metal material is higher than a melting point of the first metal material.

8. The semiconductor device of claim 1, further comprising:
a first dielectric layer disposed between the semiconductor substrate and the first metal layer; and
a second dielectric layer disposed over the first dielectric layer and laterally surrounding the top electrode structure.

9. The semiconductor device of claim 8, wherein the first dielectric layer is separated from the top electrode structure by the high-k dielectric structure.

10. The semiconductor device of claim 8, wherein the second dielectric layer is laterally separated from the top electrode structure by the high-k dielectric structure.

11. A semiconductor device, comprising:
a bottom electrode structure disposed over a semiconductor substrate, wherein the bottom electrode structure comprises:
a first metal layer;
a second metal layer disposed over the first metal layer;
a third metal layer disposed over the second metal layer;
a fourth metal layer disposed over the third metal layer;
a fifth metal layer disposed over the fourth metal layer,
wherein the first metal layer, the third metal layer and the fifth metal layer comprise a first metal material, and the second metal layer and the fourth metal layer comprise a second metal material different from the first metal material, and
wherein the first metal layer has a first width, the second metal layer has a second width, and the third metal layer has a third width, the first width is greater than the third width, and the third width is greater than the second width;
a high-k dielectric structure disposed on opposite sidewalls of the bottom electrode structure; and
a top electrode structure laterally surrounding the bottom electrode structure and separated from the bottom electrode structure by the high-k dielectric structure.

12. The semiconductor device of claim 11, wherein a melting point of the second metal material is higher than a melting point of the first metal material.

13. The semiconductor device of claim 12, wherein the first metal material is aluminum (Al), and the second metal material is copper (Cu).

14. The semiconductor device of claim 11, wherein a top surface of the bottom electrode structure is substantially coplanar with a top surface of the high-k dielectric structure.

15. The semiconductor device of claim 14, wherein a top surface of the top electrode structure is substantially coplanar with the top surface of the high-k dielectric structure.

16. The semiconductor device of claim 11, further comprising:
a first dielectric layer disposed between the semiconductor substrate and the bottom electrode structure; and
a second dielectric layer disposed over the first dielectric layer and laterally surrounding the top electrode structure, wherein a top surface of the second dielectric layer is substantially coplanar with a top surface of the top electrode structure.

17. The semiconductor device of claim 16, wherein the first dielectric layer and the second dielectric layer are separated from the top electrode structure by the high-k dielectric structure.

18. The semiconductor device of claim 11, wherein the fourth metal layer has a fourth width, and the fifth metal layer has a fifth width, the third width of the third metal layer is greater than the fifth width, and the fifth width is greater than the fourth width.

19. The semiconductor device of claim 18, wherein the bottom electrode structure further comprises:
a sixth metal layer disposed over the fifth metal layer; and
a seventh metal layer disposed over the sixth metal layer, wherein the sixth metal layer comprises the second metal material, and the seventh metal layer comprises the first metal material.

20. The semiconductor device of claim 19, wherein the sixth metal layer has a sixth width, and the seventh metal layer has a seventh width,
wherein the fifth width of the fifth metal layer is greater than the seventh width, and the seventh width is greater than the sixth width.

* * * * *